US012579937B2

(12) United States Patent
Feng et al.

(10) Patent No.: US 12,579,937 B2
(45) Date of Patent: Mar. 17, 2026

(54) DISPLAY SUBSTRATE AND DRIVING METHOD THEREFOR, AND DISPLAY APPARATUS, DRIVING APPARATUS AND MEDIUM

(71) Applicants: Hefei BOE Joint Technology Co.,Ltd., Hefei (CN); BOE Technology Group Co., Ltd., Beijing (CN)

(72) Inventors: Xuehuan Feng, Beijing (CN); Yongqian Li, Beijing (CN); Dandan Zhou, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/881,741

(22) PCT Filed: May 14, 2024

(86) PCT No.: PCT/CN2024/093035
§ 371 (c)(1),
(2) Date: Jan. 7, 2025

(87) PCT Pub. No.: WO2024/260149
PCT Pub. Date: Dec. 26, 2024

(65) Prior Publication Data
US 2026/0004727 A1 Jan. 1, 2026

(30) Foreign Application Priority Data
Jun. 21, 2023 (CN) .......................... 202310745983.0

(51) Int. Cl.
*G06F 3/042* (2006.01)
*G09G 3/02* (2006.01)
(Continued)

(52) U.S. Cl.
CPC ......... *G09G 3/3233* (2013.01); *H10K 59/131* (2023.02); *G09G 2300/0426* (2013.01); (Continued)

(58) Field of Classification Search
CPC ............... G02F 1/13318; G02F 1/1362; G02F 2201/58; G06F 3/0412; G06F 3/042; H10F 30/21
See application file for complete search history.

(56) References Cited

U.S. PATENT DOCUMENTS

| | | | |
|---|---|---|---|
| 2006/0007369 A1 | 1/2006 | Jin et al. | |
| 2012/0037905 A1* | 2/2012 | Murai ..................... | H10F 30/21 |
| | | | 257/53 |
| 2018/0270403 A1* | 9/2018 | Chung ................... | G02B 27/30 |

FOREIGN PATENT DOCUMENTS

| | | |
|---|---|---|
| CN | 114664217 A | 6/2022 |
| CN | 115000133 A | 9/2022 |

(Continued)

OTHER PUBLICATIONS

International Search Report for PCT/CN2024/093035 Mailed Jun. 25, 2024.

*Primary Examiner* — Insa Sadio
(74) *Attorney, Agent, or Firm* — Ling Wu; Stephen Yang; Ling and Yang Intellectual Property

(57) ABSTRACT

A display substrate, a driving method therefor, and a display apparatus, a driving apparatus and a medium. The display substrate comprises multiple sub-pixels, each sub-pixel comprises a pixel driving circuit and a light-emitting device, the light-emitting device at least comprises a first electrode and a pixel definition layer, the first electrode is connected to the pixel driving circuit, and a pixel opening exposing the first electrode is provided in the pixel definition layer; the pixel opening at least comprises a first opening edge and a second opening edge, and the pixel driving circuit is con- (Continued)

nected to at least one signal line; and in at least one sub-pixel, the orthographic projection of at least one of the first opening edge and the second opening edge on the plane of the display substrate at least partially overlaps with the orthographic projection of the signal line on the plane of the display substrate.

20 Claims, 14 Drawing Sheets

(51) Int. Cl.
    *G09G 3/3233*       (2016.01)
    *H10K 59/131*      (2023.01)
(52) U.S. Cl.
    CPC ............... *G09G 2300/0814* (2013.01); *G09G 2300/0842* (2013.01); *G09G 2320/0233* (2013.01)

(56)           References Cited

FOREIGN PATENT DOCUMENTS

| | | | |
|---|---|---|---|
| CN | 116189551 | A | 5/2023 |
| WO | 2021218030 | A1 | 11/2021 |
| WO | 2022160164 | A1 | 8/2022 |
| WO | 2023279333 | A1 | 1/2023 |

* cited by examiner

DISPLAY SUBSTRATE AND DRIVING METHOD THEREFOR, AND DISPLAY APPARATUS, DRIVING APPARATUS AND MEDIUM

CROSS-REFERENCE TO RELATED APPLICATIONS

The present application is a U.S. National Phase Entry of International Application PCT/CN2024/093035 having an international filing date of May 14, 2024, which claims priority to Chinese Patent Application No. 202310745983.0 filed to the CNIPA on Jun. 21, 2023 and entitled "Display Substrate, Driving Method thereof, Display Apparatus, Driving Device, and Medium", and the contents of which should be interpreted as being incorporated herein by reference.

TECHNICAL FIELD

The present disclosure relates to the technical field of display technology, in particular to a display substrate, a method for driving the display substrate, as well as a display apparatus, a driving device, and a medium.

BACKGROUND

An Organic Light Emitting Diode (OLED) and a Quantum-dot Light Emitting Diode (QLED) are active light emitting display apparatuses and have advantages such as self-illumination, wide viewing angle, high contrast ratio, low power consumption, very high response speed, lightness and thinness, flexibility, and low cost. With continuous development of display technologies, a flexible display apparatus (Flexible Display) in which an OLED or a QLED is used as a light emitting device and signal control is performed through a Thin Film Transistor (TFT for short) has become a mainstream product in the field of display at present.

SUMMARY

The following is a summary of subject matter described in the present disclosure in detail. This summary is not intended to limit the protection scope of claims.

In a first aspect, the present disclosure provides a display substrate including a plurality of sub-pixels, wherein at least one sub-pixel includes a pixel drive circuit and a light emitting device at least including a first electrode and a pixel define layer, the first electrode is connected to the pixel drive circuit, and the pixel define layer is provided with a pixel opening exposing the first electrode; the pixel opening at least includes a first opening edge located at a side of the pixel opening in a first direction and a second opening edge located a side of the pixel opening in an opposite direction of the first direction, and the pixel drive circuit is connected to at least one signal line extending along a second direction, with the first direction intersecting with the second direction; and in at least one sub-pixel, an orthographic projection of at least one of the first opening edge and the second opening edge on a plane of the display substrate is at least partially overlapped with an orthographic projection of the at least one signal line on the plane of the display substrate.

In an exemplary implementation, in at least one sub-pixel, the at least one signal line at least includes a first power supply line, and the orthographic projection of at least one of the first opening edge and the second opening edge on the plane of the display substrate is at least partially overlapped with an orthographic projection of the first power supply line on the plane of the display substrate.

In an exemplary implementation, in at least one sub-pixel, the at least one signal line at least includes a data signal line, and the orthographic projection of at least one of the first opening edge and the second opening edge on the plane of the display substrate is at least partially overlapped with an orthographic projection of the data signal line on the plane of the display substrate.

In an exemplary implementation, in at least one sub-pixel, the at least one signal line at least includes a compensation signal line, and the orthographic projection of at least one of the first opening edge and the second opening edge on the plane of the display substrate is at least partially overlapped with an orthographic projection of the compensation signal line on the plane of the display substrate.

In an exemplary implementation, the plurality of sub-pixels include a first sub-pixel, a second sub-pixel, a third sub-pixel, and a fourth sub-pixel sequentially disposed along the first direction, and the at least one signal line at least includes a first power supply line, a data signal line, and a compensation signal line; in the first sub-pixel, an orthographic projection of a first opening edge on the plane of the display substrate is at least partially overlapped with an orthographic projection of the data signal line on the plane of the display substrate, and an orthographic projection of a second opening edge on the plane of the display substrate is at least partially overlapped with an orthographic projection of the first power supply line on the plane of the display substrate; in the second sub-pixel, an orthographic projection of a first opening edge on the plane of the display substrate is at least partially overlapped with an orthographic projection of the compensation signal line on the plane of the display substrate, and an orthographic projection of a second opening edge on the plane of the display substrate is at least partially overlapped with the orthographic projection of the data signal line on the plane of the display substrate; in the third sub-pixel, an orthographic projection of a first opening edge on the plane of the display substrate is at least partially overlapped with the orthographic projection of the data signal line on the plane of the display substrate, and an orthographic projection of a second opening edge on the plane of the display substrate is at least partially overlapped with the orthographic projection of the compensation signal line on the plane of the display substrate; and in the fourth sub-pixel, the orthographic projection of the first opening edge on the plane of base substrate is at least partially overlapped with the orthographic projection of the first power supply line on the plane of the display substrate, and an orthographic projection of the second opening edge on the plane of base substrate is at least partially overlapped with the orthographic projection of the data signal line on the plane of the display substrate.

In another aspect, the present disclosure further provides a display apparatus, including the aforementioned display substrate.

In a third aspect, the present disclosure further provides a method for driving the aforementioned display substrate. The display apparatus at least includes a first sub-base substrate and a second sub-base substrate that are spliced together, wherein a splice line is formed at a junction where the first sub-base substrate and the second sub-base substrate are spliced; the first sub-base substrate at least includes a first transition region close to the splice line and a first normal region located at a side of the first transition region away from the splice line, and the second sub-base substrate at least includes a second transition region close to the splice line and a second normal region located at a side of the second transition region away from the splice line; the first transition region and the second transition region each include at least one pixel column, wherein each pixel column includes M sub-pixels, a sub-pixel at least includes a pixel drive circuit, the pixel drive circuit is connected to a drive signal line, and Mis a positive integer greater than 1; the method includes:

processing at least one original drive signal of at least one pixel column in the first transition region and the second transition region into at least one processed drive signal; and supplying the at least one processed drive signal and remaining original drive signals to M pixel drive circuits in the pixel column through a drive signal line of the pixel column.

In an exemplary implementation, in at least one of the first transition region and the second transition region, a quantity of original drive signals in the pixel column gradually decreases and a quantity of processed drive signals in the pixel column gradually increases along a direction close to the splice line.

In an exemplary implementation, in at least one of the first transition region and the second transition region, a quantity of original drive signals in a pixel column farthest from the splice line is M.

In an exemplary implementation, in at least one of the first transition region and the second transition region, a quantity of processed drive signals in a pixel column closest to the splice line is M.

In an exemplary implementation, in at least one of the first transition region and the second transition region, a quantity of processed drive signals in a pixel column closest to the splice line is $k*M$, and a quantity of the original drive signals is $(1-k)*M$, wherein k ranges from 0.2 to 0.8.

In an exemplary implementation, k=0.5.

In an exemplary implementation, the drive signal line includes a data signal line, the drive signal includes a data signal, and the at least one processed drive signal includes a first data signal;

wherein processing the at least one original drive signal of the at least one pixel column in the first transition region and the second transition region into the at least one processed drive signal includes:

processing data signals of each pixel column in the first transition region to enable data signals of an i-th pixel column to include M1 original data signals and M2 first data signals, wherein $M1=M[(i-1)/(n-1)]$, and $M2=M[1-(i-1)/(n-1)]$; wherein n is a quantity of pixel columns in the first transition region, i=1, 2, . . . , n, and a serial number of the pixel columns gradually increases along a direction away from the splice line; a first data signal is $V-\Delta V$, wherein V is an original data signal, and $\Delta V$ is an additional signal for changing the original data signal; and supplying the at least one processed drive signal and remaining original drive signals to the M pixel drive circuits in the pixel column through the drive signal line of the pixel column includes:

in each pixel column of the first normal region, the second transition region, and the second normal region, supplying M original data signals to M pixel drive circuits in the pixel column through the data signal line; and in each pixel column of the first transition region, supplying the M1 original data signals and the M2 first data signals to M pixel drive circuits in the pixel column through the data signal line.

In an exemplary implementation, the drive signal line includes a data signal line, the drive signal includes a data signal, and the at least one processed drive signal includes a second data signal;

wherein processing the at least one original drive signal of the at least one pixel column in the first transition region and the second transition region into the at least one processed drive signal includes:

processing data signals of each pixel column in the second transition region to make data signals of a j-th pixel column to include M3 original data signals and M4 second data signals, wherein $M3=M[(j-1)/(n-1)]$, and $M4=M[1-(j-1)/(n-1)]$; wherein n is a quantity of pixel columns in the second transition region, j=1, 2, . . . , n, and a serial number of the pixel columns gradually increases along a direction away from the splice line; a second data signal is $V+\Delta V$, wherein V is an original data signal, and $\Delta V$ is an additional signal for changing the original data signal; and supplying the at least one processed drive signal and the remaining original drive signals to the M pixel drive circuits in the pixel column through the drive signal line of the pixel column includes:

in each pixel column of the first transition region, the first normal region, and the second normal region, supplying M original data signals to M pixel drive circuits in the pixel column through the data signal line; and in each pixel column of the second transition region, supplying the M3 original data signals and the M4 second data signals to M pixel drive circuits in the pixel column through the data signal lines.

In an exemplary implementation, the drive signal line includes a data signal line, the drive signal line includes a data signal, and the at least one processed drive signal line includes a first data signal and a second data signal;

wherein processing the at least one original drive signal of the at least one pixel column in the first transition region and the second transition region into the at least one processed drive signal includes:

processing data signals of each pixel column of the first transition region and the second transition region to make data signals of an i-th pixel column in the first transition region to include M1 original data signals and M2 first data signals, and to make data signals of a j-th pixel column in the second transition region to include M3 original data signals and M4 second data signals, $M1=0.5*M[(i-1)/(n-1)]$, $M2=0.5*M[1-(i-1)/(n-1)]$, $M3=0.5*M[(j-1)/(n-1)]$, and $M4=0.5*M[1-(j-1)/(n-1)]$; wherein n is a quantity of pixel columns in the first transition region and the second transition region, i=1, 2, . . . , n, j=1, 2, . . . , n, and a serial number of the pixel columns gradually increases along the direction away from the splice line; a first data signal is $V-\Delta V$, a second data signal is $V+\Delta V$, wherein V is an original data signal, and $\Delta V$ is an additional signal for changing the original data signal;

supplying the at least one processed drive signal and the remaining original drive signals to the M pixel drive circuits in the pixel column through the drive signal line of the pixel column includes:

in each pixel column of the first normal region and the second normal region, supplying M original data signals to M pixel drive circuits in the pixel column through the data signal line; in each pixel column of the first transition region, supplying the M1 original data signals and the M2 first data signals to M pixel drive circuits in the pixel column through the data signal line; and in each pixel column of the second transition region, supplying the M3 original data signals and the M4 second data signals to M pixel drive circuits in the pixel column through the data signal lines.

In an exemplary implementation, the drive signal line includes a compensation signal line, the drive signal includes a compensation signal, and the at least one processed drive signal includes a first compensation signal;

wherein processing the at least one original drive signal of the at least one pixel column in the first transition region and the second transition region into the at least one processed drive signal includes:

extracting compensation signals of each pixel column in the second transition region, processing compensation signals of each pixel column in the first transition region to make the compensation signals of an i-th pixel column in the first transition region to include M1 original compensation signals and M2 first compensation signals, $M1=M[(i-1)/(n-1)]$, $M2=M[1-(i-1)/(n-1)]$; wherein n is a quantity of pixel columns in the first transition region; an original compensation signal is a compensation signal of the i-th pixel column in the first transition region, a first compensation signal is a compensation signal of a j-th pixel column in the second transition region, $i=1, 2, \ldots, n$, $j=1, 2, \ldots, n$, and a serial number of the pixel columns gradually increases along the direction away from the splice line; and supplying the at least one processed drive signal and the remaining original drive signals to the M pixel drive circuits in the pixel column through the drive signal line of the pixel column includes:

in each pixel column of the first normal region, the second transition region, and the second normal region, supplying M original compensation signals to M pixel drive circuits in the pixel column through the compensation signal line; and in each pixel column of the first transition region, supplying the M1 original compensation signals and the M2 first compensation signals to M pixel drive circuits in the pixel column through the compensation signal line.

In an exemplary implementation, the drive signal line includes a compensation signal line, the drive signal includes a compensation signal, and the at least one processed drive signal includes a second compensation signal;

wherein processing the at least one original drive signal of the at least one pixel column in the first transition region and the second transition region into the at least one processed drive signal includes:

extracting compensation signals of each pixel column in the first transition region, processing compensation signals of each pixel column in the second transition region to make compensation signals of a j-th pixel column in the second transition region to include M3 original compensation signals and M4 second compensation signals, $M3=M[(j-1)/(n-1)]$, $M4=M[1-(j-1)/(n-1)]$; wherein n is a quantity of pixel columns in the second transition region; an original compensation signal is a compensation signal of the j-th pixel column in the second transition region, a second compensation signal is a compensation signal of the i-th pixel column in the first transition region, $i=1, 2, \ldots, n$, $j=1, 2, \ldots, n$, and a serial number of the pixel columns gradually increases along the direction away from the splice line; and supplying the at least one processed drive signal and the remaining original drive signals to the M pixel drive circuits in the pixel column through the drive signal line of the pixel column includes:

in each pixel column of the first transition region, the first normal region, and the second normal region, supplying M original compensation signals to M pixel drive circuits in the pixel column through the compensation signal line; and in each pixel column of the second transition region, supplying the M3 original compensation signals and the M4 second compensation signals to M pixel drive circuits in the pixel column through the compensation signal line.

In an exemplary implementation, the drive signal line includes a compensation signal line, the drive signal line includes a compensation signal, and the at least one processed drive signal includes a first compensation signal and a second compensation signal;

wherein processing the at least one original drive signal of the at least one pixel column in the first transition region and the second transition region into the at least one processed drive signal includes:

extracting compensation signals of each pixel column in the first transition region and the second transition region, processing compensation signals of each pixel column in the first transition region and the second transition region to make compensation signals of an i-th pixel column in the first transition region to include M1 original compensation signals and M2 first compensation signals, and to make compensation signals of a j-th pixel column in the second transition region to include M3 original compensation signals and M4 second compensation signals, $M1=M[(i-1)/(n-1)]$, $M2=M[1-(i-1)/(n-1)]$, $M3=M[(j-1)/(n-1)]$, and $M4=M[1-(j-1)/(n-1)]$; wherein n is a quantity of pixel columns in the first transition region and the second transition region, $i=1, 2, \ldots, n$, $j=1, 2, \ldots, n$, and a serial number of pixel columns gradually increases along the direction away from the splice line; an original compensation signal of the first transition region is a compensation signal of the i-th pixel column in the first transition region, and a first compensation signal is a compensation signal of the j-th pixel column in the second transition region; an original compensation signal of the second transition region is a compensation signal of the j-th pixel column in the second transition region, and a second compensation signal is a compensation signal of the i-th pixel column in the first transition region; and supplying the at least one processed drive signal and the remaining original drive signals to the M pixel drive circuits in the pixel column through the drive signal line of the pixel column includes:

in each pixel column of the first normal region and the second normal region, supplying M original compensation signals to M pixel drive circuits in the pixel column through the compensation signal line; in each pixel column of the first transition region, supplying the M1 original compensation signals and the M2 first compensation signals to M pixel drive circuits in the pixel column through the compensation signal line; and in each pixel column of the second transition region, supplying the M3 original compensation signals and the M4 second compensation signals to M pixel drive circuits in the pixel column through the compensation signal line.

In a fourth aspect, the present disclosure further provides a driving device including a processor and a memory in which a computer program runnable on the processor is stored, wherein the processor performs steps of the aforementioned method for driving a display substrate when the processor executes the program.

In yet another aspect, the present disclosure further provides a non-transitory computer-readable storage medium in which program instructions are stored, wherein when the program instructions are executed, the aforementioned method for driving the display substrate is performed.

Other aspects may be comprehended upon reading and understanding drawings and detailed description.

BRIEF DESCRIPTION OF DRAWINGS

Accompanying drawings are used to provide further understanding of technical solutions of the present disclosure and form a part of the specification, and are used to explain the technical solutions of the present disclosure together with embodiments of the present disclosure, but do not form limitations on the technical solutions of the present disclosure. Shapes and sizes of various components in the drawings do not reflect actual scales, but are only intended to schematically illustrate contents of the present disclosure.

Figures 1, 2, 3:
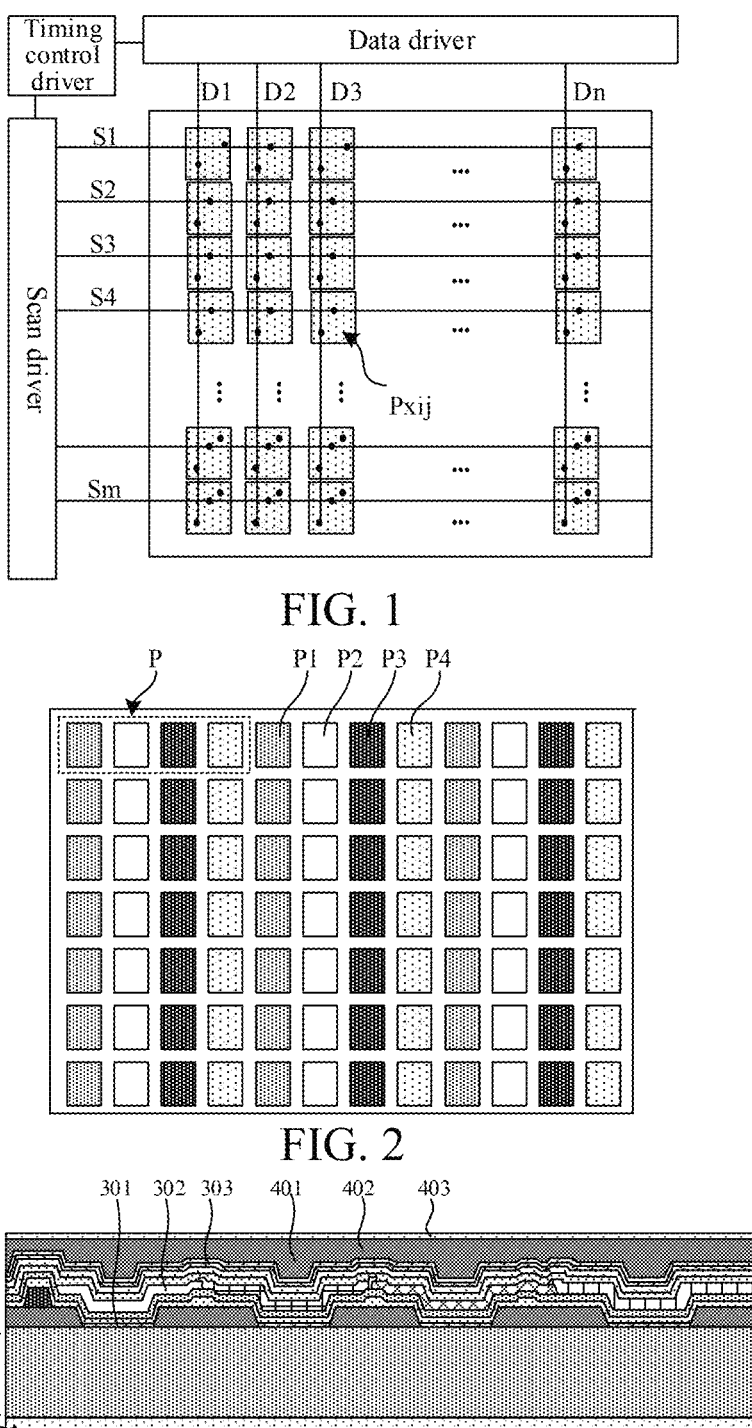
FIG. 1 is a schematic diagram of a structure of a display apparatus.
FIG. 2 is a schematic diagram of a planar structure of a display substrate.
FIG. 3 is a schematic diagram of a sectional structure of a display substrate.

| Description of reference signs: | | |
|---|---|---|
| 11—first plate; | 12—connection plate; | 13—connection line; |
| 21—power supply connection line; | 22—compensation connection line; | 23—shield layer; |
| 24—interlayer connection electrode; | 31—first active layer; | 32—second active layer; |
| 33—third active layer; | 34—second plate; | 41—first scan signal line; |
| 42—second scan signal line; | 43—second gate electrode; | 44—auxiliary power supply line; |
| 45—auxiliary data line; | 46—auxiliary compensation line; | 51—first connection electrode; |
| 52—second connection electrode; | 53—third connection electrode; | 54—fourth connection electrode; |
| 55—fifth connection electrode; | 56—sixth connection electrode; | 60—first power supply line; |
| 70—data signal line; | 80—compensation signal line; | 81—first compensation signal line; |
| 82—second compensation signal line; | 83—compensation connection electrode; | 91—first signal connection electrode; |
| 92—second signal connection electrode; | 100—first sub-base substrate; | 101—base substrate; |
| 102—drive circuit layer; | 103—light emitting structure layer; | 104—encapsulation structure layer; |
| 110—first transition region; | 120—first normal region; | 200—second sub-base substrate; |
| 210—second transition region; | 220—second normal region; | 300—splice line; |
| 301—first electrode; | 302—organic emitting layer; | 303—second electrode; |
| 401—first encapsulation layer; | 402—second encapsulation layer; | 403—third encapsulation layer; |
| 500—pixel opening; | 501—first opening edge; | 502—second opening edge. |

DETAILED DESCRIPTION

To make objectives, technical solutions, and advantages of the present disclosure clearer, the embodiments of the present disclosure will be described in detail below with reference to the accompanying drawings. Implementations may be embodied in multiple different forms. Those of ordinary skills in the art may easily understand such a fact that implementations and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to quantities shown in the drawings. The drawings described in the present disclosure are schematic structural diagrams only, and one implementation of the present disclosure is not limited to shapes, numerical values, or the like shown in the drawings.

Ordinal numerals "first", "second", "third", etc., in the specification are set not to form limits in numbers but only to avoid confusion between constituent elements.

In the specification, for convenience, expressions "central", "above", "below", "front", "back", "vertical", "horizontal", "top", "bottom", "inside", "outside", etc., for indicating directional or positional relationships are used to illustrate positional relationships between the constituent elements with reference to the accompanying drawings, not to indicate or imply that involved devices or elements are required to have specific orientations or are structured and operated in the specific orientations but only to easily describe the present specification and simplify the description, and thus should not be understood as limitations on the present disclosure. The positional relationships between the constituent elements may be changed as appropriate based on a direction according to which each constituent element is described. Therefore, appropriate replacements based on situations are allowed, which is not limited to the expressions in the specification.

In the specification, unless otherwise explicitly specified and defined, terms "mounting", "coupling", and "connection" should be understood in a broad sense. For example, a connection may be a fixed connection, or a detachable connection, or an integral connection; it may be a mechanical connection or an electrical connection; it may be a direct connection, or an indirect connection through a middleware, or an internal communication between two elements. Those of ordinary skills in the art may understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In a case that transistors with opposite polarities are used, or in a case that a direction of a current changes during operation of a circuit, or the like, functions of the "source electrode" and the "drain electrode" are sometimes interchangeable. Therefore, the "source electrode" and the "drain electrode", as well as a "source terminal" and a "drain terminal", are interchangeable in the specification.

In the specification, an "electrical connection" includes a case that constituent elements are connected together through an element with a certain electrical action. The "element with a certain electrical effect" is not particularly limited as long as electrical signals between the connected constituent elements can be sent and received. Examples of the "element with a certain electrical action" not only include an electrode and a wiring, but also include a switching element such as a transistor, a resistor, an inductor, a capacitor, another element with various functions, etc.

In the specification, "parallel" refers to a state in which an angle formed by two straight lines is above −10° and below 10°, and thus may include a state in which the angle is above −5° and below 5°. In addition, "perpendicular" refers to a state in which an angle formed by two straight lines is above 80° and below 100°, and thus may include a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

A triangle, rectangle, trapezoid, pentagon, or hexagon, etc. in the specification is not strictly defined, and it may be an approximate triangle, rectangle, trapezoid, pentagon, or hexagon, etc. There may be some small deformations caused by tolerance, and there may be a chamfer, an arc edge, deformation, etc.

In the present disclosure, "about" means that a boundary is not defined so strictly and numerical values within process and measurement error ranges are allowed.

FIG. 1 is a schematic diagram of a structure of a display apparatus. As shown in FIG. 1, an OLED display apparatus may include a timing controller, a data driver, a scan driver, and a pixel array. The timing controller is connected to the data driver and the scan driver respectively, the data driver is connected to a plurality of data signal lines (D1 to Dn) respectively, and the scan driver is connected to a plurality of scan signal lines (S1 to Sm) respectively. The sub-pixel array may include a plurality of sub-pixels Pxij. Each sub-pixel Pxij may be connected to a corresponding data signal line and a corresponding scan signal line, wherein i and j may be natural numbers. At least one sub-pixel Pxij may at least include a circuit unit and a display unit. The circuit unit may at least include a pixel drive circuit connected to a scan signal line and a data signal line respectively. The display unit may at least include a light emitting device connected to the pixel drive circuit of the circuit unit, and the sub-pixel PXij may refer to a sub-pixel in which a pixel drive circuit is connected to an i-th scan signal line and a j-th data signal line. In an exemplary implementation, the timing controller may provide a control signal and a gray scale value suitable for the specification of the data driver to the data driver, and may provide a scan start signal, a clock signal suitable for the specification of the scan driver and the like to the scan driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a pixel row as a unit, wherein n may be a natural number. The scan driver may generate scan signals to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register and generate a scan signal by sequentially transmitting scan start signals provided in a form of an on-level pulse to a next-stage circuit under control of the clock signal, wherein m may be a natural number. In an exemplary implementation, the pixel array may be arranged on a display substrate.

FIG. 2 is a schematic diagram of a planar structure of a display substrate. As shown in FIG. 2, the display substrate may include a plurality of pixel units P arranged in a matrix. At least one of the plurality of pixel units P may include a first sub-pixel P1 emitting light of a first color, a second sub-pixel P2 emitting light of a second color, a third sub-pixel P3 emitting light of a third color, and a fourth sub-pixel P4 emitting light of a fourth color. Each of the four sub-pixels may include a circuit unit and a light emitting device. The circuit unit may include a pixel drive circuit which is respectively connected to a scan signal line and a data signal line, and the pixel drive circuit is configured to receive a data voltage transmitted by the data signal line and output a corresponding current to the light emitting device under control of the scan signal line. The light emitting device in each pixel unit is connected to a pixel drive circuit of a sub-pixel where the light emitting device is located, and the light emitting device is configured to emit light with corresponding brightness in response to a current output by the pixel drive circuit of the sub-pixel where the light emitting device is located.

In an exemplary implementation, the first sub-pixel P1 may be a red sub-pixel (R) emitting red light, the second sub-pixel P2 may be a white sub-pixel (W) emitting white light, the third sub-pixel P3 may be a blue sub-pixel (B) emitting blue light, and the fourth sub-pixel P4 may be a green sub-pixel (G) emitting green light.

In an exemplary implementation, the sub-pixel may have a shape of a rectangle, a rhombus, a pentagon, or a hexagon. In an exemplary implementation, the four sub-pixels may be arranged side-by-side horizontally to form an RWBG pixel arrangement. In another exemplary implementation, the four sub-pixels may be arranged in a square, diamond, side-by-side vertically or the like, which is not limited here in the present disclosure.

FIG. 3 is a schematic diagram of a sectional structure of a display substrate, which illustrates structures of four sub-pixels of the display substrate. As shown in FIG. 3, on a plane perpendicular to the display substrate, each sub-pixel of the display substrate may include a drive circuit layer 102 arranged on a base substrate 101, a light emitting structure layer 103 arranged at a side of the drive circuit layer 102 away from the base substrate, and an encapsulation structure layer 104 arranged at a side of the light emitting structure layer 103 away from the base substrate.

In an exemplary implementation, the base substrate 101 may be a flexible base substrate, or may be a rigid base substrate. The drive circuit layer 102 of each sub-pixel may include a plurality of circuit units, and a circuit unit may at least include a pixel drive circuit composed of a storage capacitor and a plurality of transistors. The light emitting structure layer 103 of each sub-pixel may include a plurality of light emitting units, a light emitting unit may at least include a light emitting device, and the light emitting device may at least include a first electrode 301 connected to the pixel drive circuit, an organic emitting layer 302 connected to the first electrode 301, and a second electrode 303 connected to the organic emitting layer 302. The organic emitting layer 302 emits light of corresponding colors when under drive of the first electrode 301 and the second electrode 303. In an exemplary implementation, the first electrode may be an anode and the second electrode may be a cathode. Or, the first electrode may be a cathode and the second electrode may be an anode. The encapsulation structure layer 104 may include a first encapsulation layer 401, a second encapsulation layer 402, and a third encapsulation layer 403 which are stacked. The first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, which may ensure that external moisture cannot enter the light emitting structure layer 103.

In an exemplary implementation, the organic emitting layer may include a Hole Injection Layer (HIL), a Hole Transport Layer (HTL), an Electron Block Layer (EBL), an Emitting Layer (EML), a Hole Block Layer (HBL), an Electron Transport Layer (ETL), and an Electron Injection Layer (EIL). In an exemplary implementation, the hole injection layer, the hole transport layer, the electron block layer, the hole block layer, the electron transport layer and the electron injection layer of all sub-pixels may be connected together to form a common layer, and the emitting layers of all sub-pixels may be connected together to form a common layer, or may be isolated from each other, and emitting layers of adjacent sub-pixels may be slightly overlapped. In some possible implementations, the display substrate may include other film layers, and the present disclosure is not limited thereto.

Figures 4, 5:
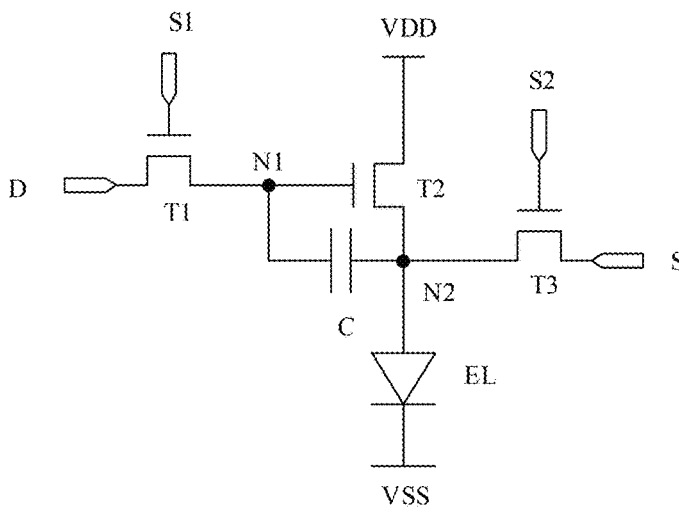
FIG. 4 is an equivalent circuit diagram of a pixel drive circuit.
FIG. 5 is a schematic diagram of a structure of a display substrate according to an exemplary implementation of the present disclosure.

FIG. 4 is a schematic diagram of an equivalent circuit of a pixel drive circuit. As shown in FIG. 4, the pixel drive circuit has a 3T1C structure that may include three transistors (a first transistor T1, a second transistor T2, and a third transistor T3) and one storage capacitor C. The pixel drive circuit is connected to five signal lines (a first scan signal line S1, a second scan signal line S2, a data signal line D, a compensation signal line S, and a first power supply line VDD) respectively.

In an exemplary implementation, the pixel drive circuit may include a first node N1 and a second node N2. The first node N1 is connected to a second electrode of the first transistor T1, a gate electrode of the second transistor T2 and a first end of the storage capacitor C respectively, and the second node N2 is connected to a second electrode of the second transistor T2, a second electrode of the third transistor T3 and a second end of the storage capacitor C respectively.

In an exemplary implementation, the first transistor T1 is a switch transistor, the second transistor T2 is a drive transistor, and the third transistor T3 is a compensation transistor. A first end of the storage capacitor C is connected to the first node N1, a second end of the storage capacitor C is connected to the second node N2, and the storage capacitor C is configured to store a potential of the gate electrode of the second transistor T2.

In an exemplary implementation, a gate electrode of the first transistor T1 is connected to the first scan signal line S1, a first electrode of the first transistor T1 is connected to the data signal line D, and the second electrode of the first transistor T1 is connected to the first node N1. When a turn-on signal is applied to the first scan signal line S1, the first transistor T1 inputs a data signal of the data signal line D to the gate electrode of the second transistor T2.

In an exemplary implementation, the gate electrode of the second transistor T2 is connected to the first node N1, a first electrode of the second transistor T2 is connected to the first power supply line VDD, and the second electrode of the second transistor T2 is connected to the second node N2. The second transistor T2 generates a corresponding current at the second electrode of the second transistor T2 under control of the data signal received by the gate electrode of the second transistor T2.

In an exemplary implementation, a gate electrode of the third transistor T3 is connected to the second scan signal line S2, a first electrode of the third transistor T3 is connected to the compensation signal line S, and the second electrode of the third transistor T3 is connected to the second node N2. When a turn-on signal is applied to the second scan signal line S2, the third transistor T3 extracts a threshold voltage Vth and a migration rate of the second transistor T2 in response to a compensation timing, to compensate the threshold voltage Vth.

In an exemplary implementation, the light emitting device EL may be an OLED which includes a first electrode, an organic emitting layer, and a second electrode that are stacked, or may be a QLED which includes a first electrode, a quantum dot emitting layer, and a second electrode that are stacked. The first electrode of the light emitting device EL is connected to the second node N2, the second electrode of the light emitting device EL is connected to a second power supply line VSS, and the light emitting device EL is configured to emit light with corresponding brightness in response to a current of the second electrode of the second transistor T2.

In an exemplary implementation, a signal of the first power supply line VDD is a high-level signal continuously provided, and a signal of the second power supply line VSS is a low-level signal continuously provided.

In an exemplary implementation, the first transistor T1 to the third transistor T3 may be P-type transistors, or may be N-type transistors. Use of a same type of transistors in a pixel drive circuit may simplify a process flow, reduce a process difficulty of a display panel, and improve a product yield. In some possible implementations, the first transistor T1 to the third transistor T3 may include a P-type transistor and an N-type transistor.

In an exemplary implementation, for the first transistor T1 to the third transistors T3, low temperature poly-silicon thin film transistors may be used, oxide thin film transistors may be used, or a low temperature poly-silicon thin film transistor and an oxide thin film transistor may be used. An active layer of a low temperature poly-silicon thin film transistor is made of Low Temperature Poly-Silicon (LTPS for short), and an active layer of an oxide thin film transistor is made of an Oxide semiconductor. The low temperature poly-silicon thin film transistor has advantages, such as a high mobility and fast charging, and the oxide thin film transistor has advantages, such a low leakage current. The low temperature poly-silicon thin film transistor and the oxide thin film transistor are integrated on one display substrate, that is, an LTPS+Oxide (LTPO for short) display substrate, so that advantages of the low temperature poly-silicon thin film transistor and the oxide thin film transistor may be utilized, low-frequency drive may be achieved, power consumption may be reduced, and a display quality may be improved.

An exemplary implementation of the present disclosure provides a display substrate including a plurality of sub-pixels. At least one sub-pixel includes a pixel drive circuit and a light emitting device at least including a first electrode and a pixel define layer. The first electrode is connected to the pixel drive circuit, and the pixel define layer is provided with a pixel opening exposing the first electrode. The pixel opening at least includes a first opening edge located at a side of a first direction of the pixel opening and a second opening edge located at an opposite side of the first direction of the pixel opening. The pixel drive circuit is connected to at least one signal line extending along a second direction, wherein the first direction intersects with the second direction. In at least one sub-pixel, an orthographic projection of at least one of the first opening edge and the second opening edge on a plane of the display substrate is at least partially overlapped with the orthographic projection of the signal line on the plane of the display substrate.

In an exemplary implementation, in at least one sub-pixel, the signal line at least includes a first power supply line, and the orthographic projection of at least one of the first opening edge and the second opening edge on the plane of the display substrate is at least partially overlapped with an orthographic projection of the first power supply line on the plane of the display substrate.

In an exemplary implementation, in at least one sub-pixel, the signal line at least includes a data signal line, and the orthographic projection of at least one of the first opening edge and the second opening edge on the plane of the display substrate is at least partially overlapped with an orthographic projection of the data signal line on the plane of the display substrate.

In an exemplary implementation, in at least one sub-pixel, the signal line at least includes a compensation signal line, and the orthographic projection of at least one of the first opening edge and the second opening edge on the plane of the display substrate is at least partially overlapped with the orthographic projection of the compensation signal line on the plane of the display substrate.

In an exemplary implementation, the plurality of sub-pixels include a first sub-pixel, a second sub-pixel, a third sub-pixel, and a fourth sub-pixel sequentially disposed along the first direction, and the signal lines at least include a first power supply line, a data signal line, and a compensation signal line. In the first sub-pixel, an orthographic projection of the first opening edge on the plane of the display substrate is at least partially overlapped with the orthographic projection of the data signal line on the plane of the display substrate, and an orthographic projection of the second opening edge on the plane of the display substrate is at least partially overlapped with the orthographic projection of the first power supply line on the plane of the display substrate. In the second sub-pixel, an orthographic projection of the first opening edge on the plane of the display substrate is at least partially overlapped with the orthographic projection of the compensation signal line on the plane of the display substrate, and an orthographic projection of the second opening edge on the plane of the display substrate is at least partially overlapped with the orthographic projection of the data signal line on the plane of the display substrate. In the third sub-pixel, an orthographic projection of the first opening edge on the plane of the display substrate is at least partially overlapped with the orthographic projection of the data signal line on the plane of the display substrate, and an orthographic projection of the second opening edge on the plane of the display substrate is at least partially overlapped with the orthographic projection of the compensation signal line on the plane of the display substrate. In the fourth sub-pixel, an orthographic projection of the first opening edge on the base substrate is at least partially overlapped with the orthographic projection of the first power supply line on the plane of the display substrate, and an orthographic projection of the second opening edge on the base substrate is at least partially overlapped with the orthographic projection of the data signal line on the plane of the display substrate.

The display substrate in the present disclosure will be illustrated with examples below through some exemplary implementations.

In an exemplary implementation, on a direction perpendicular to the display substrate, the display substrate may at least include a drive circuit layer disposed on the base substrate and a light emitting structure layer disposed at a side of the drive circuit layer away from the base substrate. In an exemplary implementation, the drive circuit layer may include a plurality of circuit units, the light emitting structure layer may include a plurality of light emitting units, a circuit unit may at least include a pixel drive circuit, and a light emitting unit may at least include a light emitting device connected to a pixel drive circuit of a corresponding circuit unit.

In an exemplary implementation, circuit units mentioned in the present disclosure refer to regions divided according to pixel drive circuits, and light emitting units mentioned in the present disclosure refer to regions divided according to light emitting devices. In an exemplary implementation, a position of an orthographic projection of a light emitting unit on the base substrate may correspond to a position of an orthographic projection of a circuit unit on the base substrate, or the position of the orthographic projection of the light emitting unit on the base substrate may not correspond to the position of the orthographic projection of the circuit unit on the base substrate.

In an exemplary implementation of the present disclosure, a position of an orthographic projection of a circuit unit on the base substrate is in one-to-one correspondence with a position of an orthographic projection of a light emitting unit on the base substrate, and the circuit unit and the light emitting unit constitute a sub-pixel. Therefore, sub-pixels are uniformly used to refer to circuit units and light emitting units in following context.

In an exemplary implementation, a plurality of sub-pixels sequentially disposed along a first direction X may be referred to as a pixel row, and a plurality of sub-pixels sequentially disposed along a second direction Y may be referred to as a pixel column, and a plurality of pixel rows and a plurality of pixel columns form a pixel array arranged in a matrix, wherein the first direction X intersect with the second direction Y.

In an exemplary implementation, the first direction X may be a horizontal direction, the second direction Y may be a vertical direction, and the first direction X and the second direction Y are perpendicular to each other.

FIG. 5 is a schematic diagram of a structure of a display substrate according to an exemplary implementation of the present disclosure, illustrating a structure of a pixel drive circuit of one pixel unit (four sub-pixels) in a bottom-emission display substrate. As shown in FIG. 5, in a direction parallel to the display substrate, at least one pixel unit may include a first sub-pixel P1, a second sub-pixel P2, a third sub-pixel P3, and a fourth sub-pixel P4 sequentially arranged along the first direction X, and each sub-pixel may include a pixel drive circuit.

In an exemplary implementation, at least one pixel unit may include one first scan signal line 41, one second scan signal line 42, two first power supply lines 60, four data signal lines 70, and one compensation signal line 80, and all the signal lines described above are connected to pixel drive circuits in the four sub-pixels.

In an exemplary implementation, shapes of the first scan signal line 41 and the second scan signal line 42 may be a straight line or a polyline extending along the first direction X, and the first scan signal line 41 and the second scan signal line 42 are sequentially disposed along the second direction Y. Shapes of the first power supply lines 60, the data signal lines 70, and the compensation signal line 80 may be straight lines or polylines extending along the second direction Y. The two first power supply lines 60 may be respectively arranged on two sides of the pixel unit in the first direction X, the four data signal lines 70 and the one compensation signal line 80 may be arranged between the two first power supply lines 60, two of the four data signal lines 70 may be located between the compensation signal line 80 and one of the first power supply lines 60, and the other two of the four data signal lines 70 may be located between the compensation signal line 80 and the other of the first power supply lines 60.

In an exemplary implementation, a first sub-pixel P1 is formed between a first power supply line 60 and an adjacent data signal line 70 in the first direction X, a second sub-pixel P2 is formed between the compensation signal line 80 and an adjacent data signal line 70 in an opposite direction of the first direction X, a third sub-pixel P3 is formed between the compensation signal line 80 and an adjacent data signal line 70 in the first direction X, and a fourth sub-pixel P4 is formed between the other first power supply line 60 and an adjacent data signal line 70 in the opposite direction of the first direction X.

In an exemplary implementation, among the four sub-pixels of the pixel unit, a pixel drive circuit of at least one sub-pixel may include a first transistor T1, a second transistor T2, a third transistor T3 and a storage capacitor. The first transistor T1, the second transistor T2, and the third transistor T3 may each include an active layer, a gate electrode, a first electrode, and a second electrode, and the storage capacitor may include a transparent first plate and a transparent second plate to form a transparent storage capacitor.

In an exemplary implementation, the first scan signal line 41 is connected to a gate electrode of the first transistor T1 in each sub-pixel, and the second scan signal line 42 is connected to a gate electrode of the third transistor T3 in each sub-pixel, the data signal line 70 is connected to a first electrode of the first transistor T1 in each sub-pixel, and the compensation signal line 80 is connected to a first electrode of the third transistor T3 in each sub-pixel. The first power supply line 60 is connected to a first electrode of the second transistor T2 in each sub-pixel. In each sub-pixel, a second electrode of the first transistor T1 is connected to a gate electrode of the second transistor T2. In each sub-pixel, a second electrode of the second transistor T2 is connected to the first electrode of the third transistor T3. In each sub-pixel, a first plate is connected to the second electrode of the second transistor T2 and the second electrode of the third transistor T3 respectively, and a second plate is connected to the second electrode of the first transistor T1 and the gate electrode of the second transistor T2 respectively.

In an exemplary implementation, at least one pixel unit may further include a plurality of connection lines. The plurality of connection lines may at least include two power supply connection lines 21 extending along the first direction X and two compensation connection lines 22 extending along the first direction X, thereby forming a one-for-two structure of a first power supply line and a one-for-four structure of a compensation signal line.

In an exemplary implementation, a power supply connection line 21 is provided in the first sub-pixel P1 and the second sub-pixel P2, a first end of the power supply connection line 21 is connected to a first power supply line 60 located in the first sub-pixel P1, and a second end of the power supply connection line 21 is connected to a second transistor T2 in the second sub-pixel P2. Another power supply connection line 21 is provided in the third sub-pixel P3 and the fourth sub-pixel P4, a first end of the power supply connection line 21 is connected to the first power supply line 60 located in the fourth sub-pixel P4, and a second end of the power supply connection line 21 is connected to a second transistor T2 in the third sub-pixel P3. Thus, one first power supply line 60 can provide a power supply signal to pixel drive circuits of two sub-pixels through one power supply connection line 21.

In an exemplary implementation, one compensation connection line 22 is provided in the first sub-pixel P1 and the second sub-pixel P2. On the one hand, the compensation connection line 22 is connected to the compensation signal line 80, and on the other hand, the compensation connection line 22 is respectively connected to a third transistor T3 of the first sub-pixel P1 and a third transistor T3 of the second sub-pixel P2. Another compensation connection line 22 is provided in the third sub-pixel P3 and the fourth sub-pixel P4, on the one hand, the compensation connection line 22 is connected to the compensation signal line 80, and on the other hand, the compensation connection line 22 is respectively connected to a third transistor T3 of the third sub-pixel P3 and a third transistor T3 of the fourth sub-pixel P4. Thus, one compensation signal line 80 can provide a compensation signal to pixel drive circuits of four sub-pixels.

According to the embodiment of the present disclosure, through the one-for-two structure of the first power supply line and the one-for-four structure of the compensation signal line, a quantity of signal lines is saved, occupied space is reduced, a structure is simple, a layout is reasonable, layout space is fully utilized, a space utilization rate is improved, which is beneficial to improving a resolution.

In an exemplary implementation, on a direction perpendicular to the display substrate, the display substrate may at least include a drive circuit layer disposed on the base substrate and a light emitting structure layer disposed at a side of the drive circuit layer away from the base substrate. The drive circuit layer may include a transparent conductive layer, a first conductive layer, a first insulation layer, a semiconductor layer, a second insulation layer, a second conductive layer, a third insulation layer, and a third conductive layer which are stacked on the base substrate. The light emitting structure layer may include an electrode conductive layer at the side of the drive circuit layer away from the base substrate and a pixel define layer at a side of the electrode conductive layer away from the base substrate. The electrode conductive layer may include a plurality of first electrodes connected to corresponding pixel drive circuits. The pixel define layer may include a plurality of pixel openings exposing the corresponding first electrodes. In an exemplary implementation, the first electrode may be an anode, or, the first electrode may be a cathode.

Figures 6, 7:
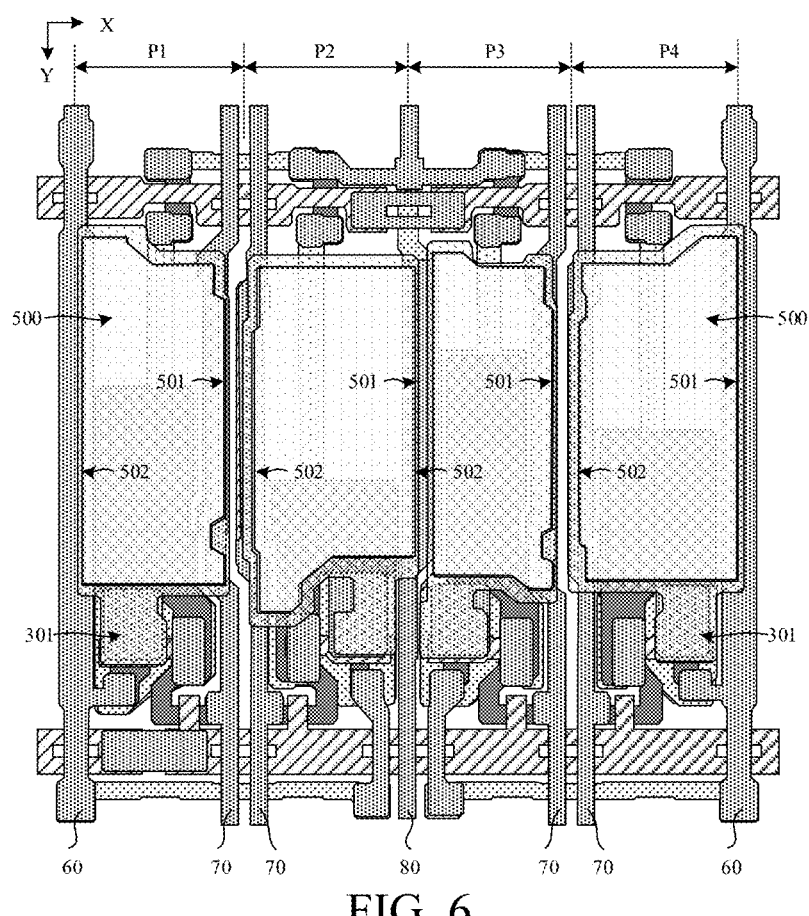
FIG. 6 is another schematic diagram of a structure of a display substrate according to an exemplary implementation of the present disclosure.
FIG. 7 is a schematic diagram after a pattern of a transparent conductive layer is formed according to an embodiment of the present disclosure.

FIG. 6 is another schematic diagram of a structure of a display substrate according to an exemplary implementation of the present disclosure, schematically illustrating structures of an electrode conductive layer and a pixel define layer in a bottom-emission display substrate. As shown in FIG. 6, the electrode conductive layer may at least include a plurality of first electrodes 301, and the plurality of first electrodes 301 are respectively provided in a plurality of sub-pixels, and are respectively connected to pixel drive circuits of corresponding sub-pixels. The pixel define layer may at least include a plurality of pixel openings 500, and the plurality of pixel openings 500 are respectively provided in a plurality of sub-pixels, and respectively exposing first electrodes 301 of the sub-pixels where the pixel opening are located.

In an exemplary implementation, the pixel opening 500 of each sub-pixel may at least include a first opening edge 501 located at a side of the pixel opening in the first direction X and a second opening edge 502 located at a side of the pixel opening in the opposite direction of the first direction X, and shapes of the first opening edge 501 and the second opening edge 502 may be straight lines or polylines extending along the second direction Y.

In an exemplary implementation, in at least one sub-pixel, an orthographic projection of at least one of the first opening edge 501 and the second opening edge 502 on the base substrate is at least partially overlapped with an orthographic projection of a first power supply line 60 on the base substrate.

In an exemplary implementation, in at least one sub-pixel, the orthographic projection of at least one of the first opening edge 501 and the second opening edge 502 on the base substrate is at least partially overlapped with an orthographic projection of a data signal line 70 on the base substrate.

In an exemplary implementation, in at least one sub-pixel, the orthographic projection of at least one of the first opening edge 501 and the second opening edge 502 on the base substrate is at least partially overlapped with an orthographic projection of the compensation signal line 80 on the base substrate.

In an exemplary implementation, in the first sub-pixel P1, an orthographic projection of the first opening edge 501 on the base substrate is at least partially overlapped with the orthographic projection of the data signal line 70 on the base substrate, and an orthographic projection of the second opening edge 502 on the base substrate is at least partially overlapped with the orthographic projection of the first power supply line 60 on the base substrate.

In an exemplary implementation, in the second sub-pixel P2, an orthographic projection of the first opening edge 501 on the base substrate is at least partially overlapped with the orthographic projection of the compensation signal line 80 on the base substrate, and an orthographic projection of the second opening edge 502 on the base substrate is at least partially overlapped with the orthographic projection of the data signal line 70 on the base substrate.

In an exemplary implementation, in the third sub-pixel P3, an orthographic projection of the first opening edge 501 on the base substrate is at least partially overlapped with the orthographic projection of the data signal line 70 on the base substrate, and an orthographic projection of the second opening edge 502 on the base substrate is at least partially overlapped with the orthographic projection of the compensation signal line 80 on the base substrate.

In an exemplary implementation, in the fourth sub-pixel P4, an orthographic projection of the first opening edge 501 on the base substrate is at least partially overlapped with the orthographic projection of the first power supply line 60 on the base substrate, and an orthographic projection of the second opening edge 502 on the base substrate is at least partially overlapped with the orthographic projection of the data signal line 70 on the base substrate.

Exemplary description is made below through a manufacturing process of a display substrate. A "patterning process" mentioned in the present disclosure includes photoresist coating, mask exposure, development, etching, photoresist stripping, and other treatments for a metal material, an inorganic material, or a transparent conductive material, and includes organic material coating, mask exposure, development, and other treatments for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through a patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are provided in a same layer" in the present disclosure means that A and B are formed simultaneously through a same patterning process, and a "thickness" of a film layer is a dimension of the film layer in a direction perpendicular to a display substrate. In an exemplary implementation of the present disclosure, "an orthographic projection of B is within an orthographic projection of A" or "an orthographic projection of A contains an orthographic projection of B" refers to that a boundary of the orthographic projection of B falls within a boundary of the orthographic projection of A, or the boundary of the orthographic projection of A coincides with the boundary of the orthographic projection of B.

In an exemplary implementation, taking one pixel unit including four sub-pixels (a first sub-pixel P1, a second sub-pixel P2, a third sub-pixel P3, and a fourth sub-pixel P4) as an example, a manufacturing process of a display substrate of an exemplary implementation of the present disclosure may include following operations.

(11) A pattern of a transparent conductive layer is formed. In an exemplary implementation, forming the pattern of the transparent conductive layer may include: depositing a transparent conductive thin film on a base substrate, patterning the transparent conductive thin film through a patterning process, to form the pattern of the transparent conductive layer on the base substrate, as shown in FIG. 7. In an exemplary implementation, the transparent conductive layer may be referred to as an ITO layer.

In an exemplary implementation, a pattern of a transparent conductive layer of each sub-pixel may at least include a first plate 11, a connection plate 12, and a connection line 13 of a storage capacitor.

In an exemplary implementation, the first plate 11 may have a rectangular shape, and corners of the rectangular shape may be provided with chamfers. An edge of the rectangular shape may be a polyline, the first plate 11 may be arranged in a middle region of the sub-pixel in a second direction Y, and the first plate 11 is configured to form one transparent plate of a transparent storage capacitor.

In an exemplary implementation, a shape of the connection plate 12 may be a polygonal shape, the connection plate 12 may be arranged at a side of the first plate 11 in the second direction Y and is connected to the first plate 11, and the connection plate 12 is configured to be connected to a shield layer to be formed subsequently.

In an exemplary implementation, a shape of the connection line 13 may be a strip shape extending along the second direction Y, and the connection line 13 may be arranged at a side of the first plate 11 away from the connection plate 12 and is connected to the first plate 11. A connection block 13-1 may be provided at an end of the connection line 13 away from the first plate 11, a shape of the connection block 13-1 may be a strip shape extending along a first direction X and is connected to the connection line 13, and the connection block 13-1 is configured to be connected to an interlayer connection electrode to be formed subsequently.

In an exemplary implementation, the first plate 11, the connection 12, and the connection line 13 of each sub-pixel may be connected to each other into an integral structure.

Figure 8A:
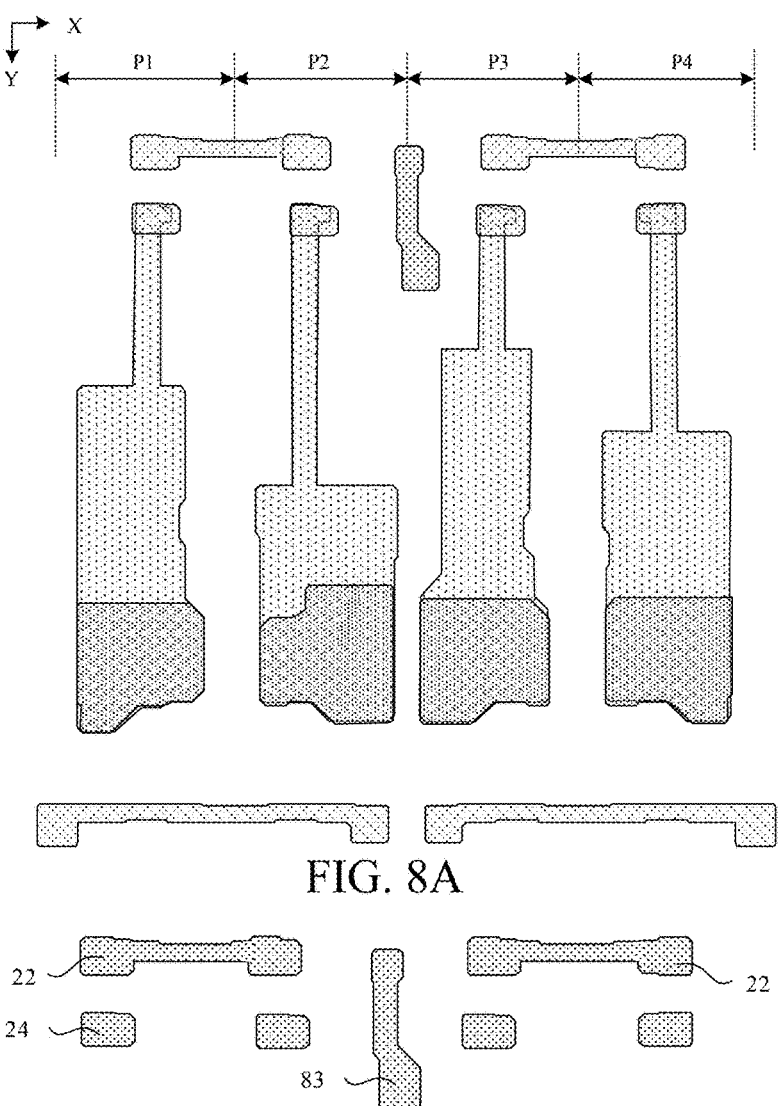
FIGS. 8A and 8B are schematic diagrams after a pattern of a first conductive layer is formed according to an embodiment of the present disclosure.
Figure 8B:
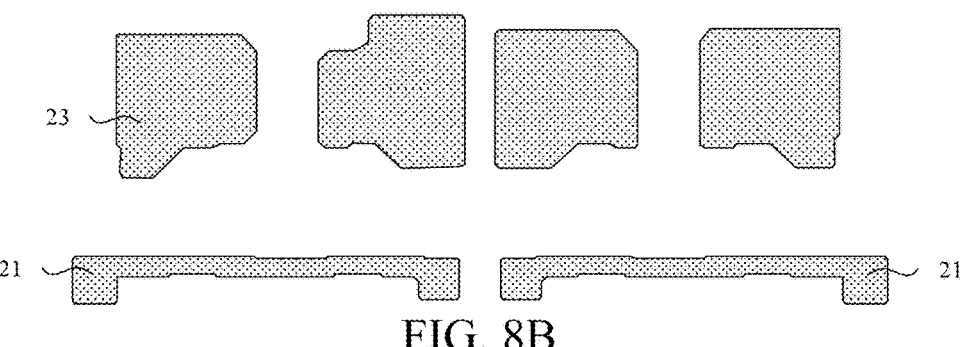

(12) A pattern of a first conductive layer is formed. In an exemplary implementation, forming the pattern of the first conductive layer may include: depositing a first conductive thin film on the base substrate on which the aforementioned pattern is formed, and patterning the first conductive thin film through a patterning process to form the pattern of the first conductive layer on the transparent conductive layer, as shown in FIG. 8A and FIG. 8B, and FIG. 8B is a schematic plan view of the first conductive layer in FIG. 8A. In an exemplary implementation, the first conductive layer may be referred to as a shield metal (SHL) layer.

In an exemplary implementation, a pattern of a first conductive layer in each sub-pixel may at least include a power supply connection line 21, a compensation connection line 22, a shield layer 23, and an interlayer connection electrode 24.

In the exemplary implementation, a shape of the power supply connection line 21 may be a strip shape extending along the first direction X, and the power supply connection line 21 may also be used as a horizontal power supply connection line of a pixel unit and be connected to a first power supply line to be formed subsequently to provide a power supply signal to a second transistor T2 of the sub-pixel where the power supply connection line 21 is located.

In an exemplary implementation, power supply connection lines 21 of sub-pixels adjacent in the first direction X may be connected to each other into an integral structure. For example, the power supply connection lines 21 in the first sub-pixel P1 and the second sub-pixel P2 are connected to each other into an integral structure, and the power supply connection lines 21 in the third sub-pixel P3 and the fourth sub-pixel P3 are connected to each other into an integral structure, but the power supply connection lines 21 in the second sub-pixel P2 and the third sub-pixel P3 are not connected to each other.

In an exemplary implementation, a shape of the compensation connection line 22 may be a strip shape extending along the first direction X, and the compensation connection line 22 may also be used as a horizontal compensation connection line of a pixel unit and be connected to a compensation signal line to be formed subsequently to provide a compensation voltage to a third transistor T3 of the sub-pixel where the compensation connection line 22 is located.

In an exemplary implementation, compensation connection lines 22 of part of sub-pixels adjacent in the first direction X may be connected to each other into an integral structure. For example, the compensation connection lines 22 in the first sub-pixel P1 and the second sub-pixel P2 are connected to each other into an integral structure, and the compensation connection lines 22 in the third sub-pixel P3 and the fourth sub-pixel P3 are connected to each other into an integral structure, but the compensation connection lines 22 in the second sub-pixel P2 and the third sub-pixel P3 are not connected to each other.

In an exemplary implementation, a shape of the shield layer 23 may be a rectangular shape and the shield layer 23 may be arranged between the power supply connection lines 21 and the compensation connection lines 22, and the shield layer 23 is configured to provide shielding for the second transistor T2 to avoid an influence of light on a channel and reduce a leakage current, thereby avoiding an influence of illumination on characteristics of transistors and ensuring electrical performance of the second transistor T2.

In an exemplary implementation, an orthographic projection of the shield layer 23 on the base substrate may be within an orthographic projection of the connection plate 12 on the base substrate, and the shield layer 23 is directly lapped with the connection plate 12.

In an exemplary implementation, a shape of the interlayer connection electrode 24 may be a rectangular shape and the interlayer connection electrode 24 may be arranged between the shield layer 23 and the compensation connection line 22, and the interlayer connection electrode 24 is configured to be connected to a second electrode of the third transistor T3 to be formed subsequently.

In an exemplary implementation, an orthographic projection of the interlayer connection electrode 24 on the base substrate is at least partially overlapped with an orthographic projection of the connection block 13-1 of the connection line 13 on the base substrate, and the interlayer connection electrode 24 is directly lapped with the connection block 13-1.

In an exemplary implementation, a pattern of a first conductive layer of each pixel unit may further include a compensation connection electrode 83. A shape of the compensation connection electrode 83 may be a strip shape extending along the second direction Y, the compensation connection electrode 83 may be arranged between compensation connection lines 22 adjacent in the first direction X, i.e., the compensation connection electrode 83 may be arranged between the second sub-pixel P2 and the third sub-pixel P3, and the compensation connection electrode 83 is configured as a connection electrode of a compensation signal line to connect a first compensation signal line with a second compensation signal line which are arranged at intervals by being connected to a compensation signal line to be formed subsequently.

Figures 9A, 9B:
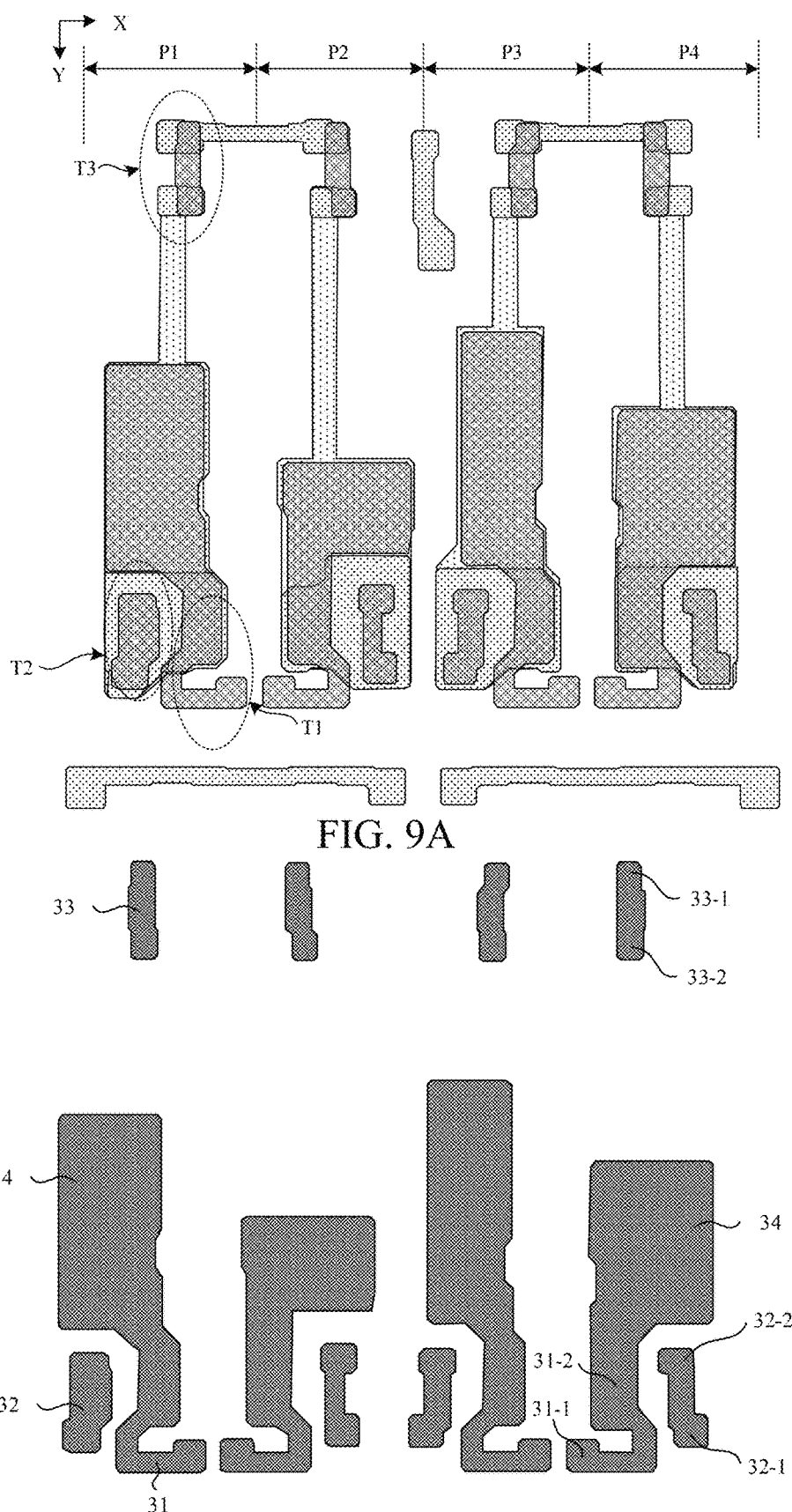
FIGS. 9A and 9B are schematic diagrams after a pattern of a semiconductor layer is formed according to an embodiment of the present disclosure.

(13) A pattern of a semiconductor layer is formed. In an exemplary implementation, forming the pattern of the semiconductor layer may include: sequentially depositing a first insulation thin film and a semiconductor thin film on the base substrate on which the aforementioned patterns are formed, and patterning the semiconductor thin film through a patterning process to form a first insulation layer covering the first conductive layer and the pattern of the semiconductor layer arranged on the first insulation layer, as shown in FIGS. 9A and 9B, wherein FIG. 9B is a schematic plan view of the semiconductor layer in FIG. 9A.

In an exemplary implementation, a pattern of a semiconductor layer in each sub-pixel may at least include a first active layer 31, a second active layer 32, a third active layer 33, and a second plate 34.

In an exemplary implementation, a shape of the second plate 34 may be a rectangular shape, and an orthographic projection of the second plate 34 on the base substrate is at least partially overlapped with an orthographic projection of the first plate 11 on the base substrate. The second plate 34 is configured to form the other transparent plate of the transparent storage capacitor, and the first plate 11 and the second plate 34 constitute the transparent storage capacitor.

In an exemplary implementation, the first active layer 31 may serve as an active layer of a first transistor T1, the second active layer 32 may serve as an active layer of a second transistor T2, and the third active layer 33 may serve as an active layer of a third transistor T3. The first active layer 31 and the second active layer 32 may be arranged between the power supply connection line 21 and the second plate 34, and the third active layer 33 may be arranged between the compensation connection line 22 and the second plate 34.

In an exemplary implementation, the first active layer 31, the second active layer 32, and the third active layer 33 may each include a channel region, and a first region and a second region located on two sides of the channel region.

In an exemplary implementation, a shape of the first active layer 31 may be an "L" shape, a first region 31-1 of the first active layer 31 may be located at a side of a channel region away from the second plate 34, a second region 31-2 of the first active layer 31 may be located at a side of the channel region close to the second plate 34, and an orthographic projection of the second region 31-2 of the first active layer 31 on the base substrate is at least partially overlapped with an orthographic projection of the shield layer 23 on the base substrate.

In an exemplary implementation, the second region 31-2 of the first active layer 31 may be connected to the second plate 34, and the first active layer 31 and the second plate 34 may be connected to each other into an integral structure.

In an exemplary implementation, a shape of the second active layer 32 may be an "I" shape, and an orthographic projection of the second active layer 32 on the base substrate is at least partially overlapped with an orthographic projection of the shield layer 23 on the base substrate. In an exemplary implementation, an orthographic projection of a channel region of the second active layer 32 on the base substrate may be within the orthographic projection of the shield layer 23 on the base substrate, and the shield layer 23 may shield the channel region of the second active layer 32 to avoid an influence of light on a channel and reduce a leakage current, thereby avoiding an influence of illumination on characteristics of transistors. A first region 32-1 of the second active layer 32 may be located at a side of the channel region away from the second plate 34, and an orthographic projection of a first region 32-1 of the second active layer 32 on the base substrate may be within the orthographic projection of the shield layer 23 on the base substrate. A second region 32-2 of the second active layer 32 may be located at a side of the channel region close to the second plate 34.

In an exemplary implementation, a shape of the third active layer 33 may be an "I" shape and an orthographic projection of the third active layer 33 on the base substrate and an orthographic projection of the second plate 34 on the base substrate are arranged at an interval, that is, the third active layer 33 do not overlap with the second plate 42, which is beneficial to designing a width-to-length ratio of a channel of a third transistor according to relevant requirements. A first region 33-1 of the third active layer 33 may be located at a side of a channel region away from the second plate 34, and an orthographic projection of the first region 33-1 of the third active layer 33 on the base substrate is at least partially overlapped with an orthographic projection of the compensation connection line 22 on the base substrate. A second region 33-2 of the third active layer 33 may be located at a side of the channel region close the second plate 34, and an orthographic projection of the second region 33-2 of the third active layer 33 on the base substrate is at least partially overlapped with an orthographic projection of the interlayer connection electrode 24 on the base substrate.

In an exemplary implementation, the semiconductor layer may be made of a metal oxide such as an oxide containing indium and tin, an oxide containing tungsten and indium, an oxide containing tungsten, indium and zinc, an oxide containing titanium and indium, an oxide containing titanium, indium and tin, an oxide containing indium and zinc, an oxide containing silicon, indium and tin, an oxide containing indium, gallium and zinc, etc. The semiconductor layer may be a single layer, two layers, or a plurality of layers.

Figures 10A, 10B:
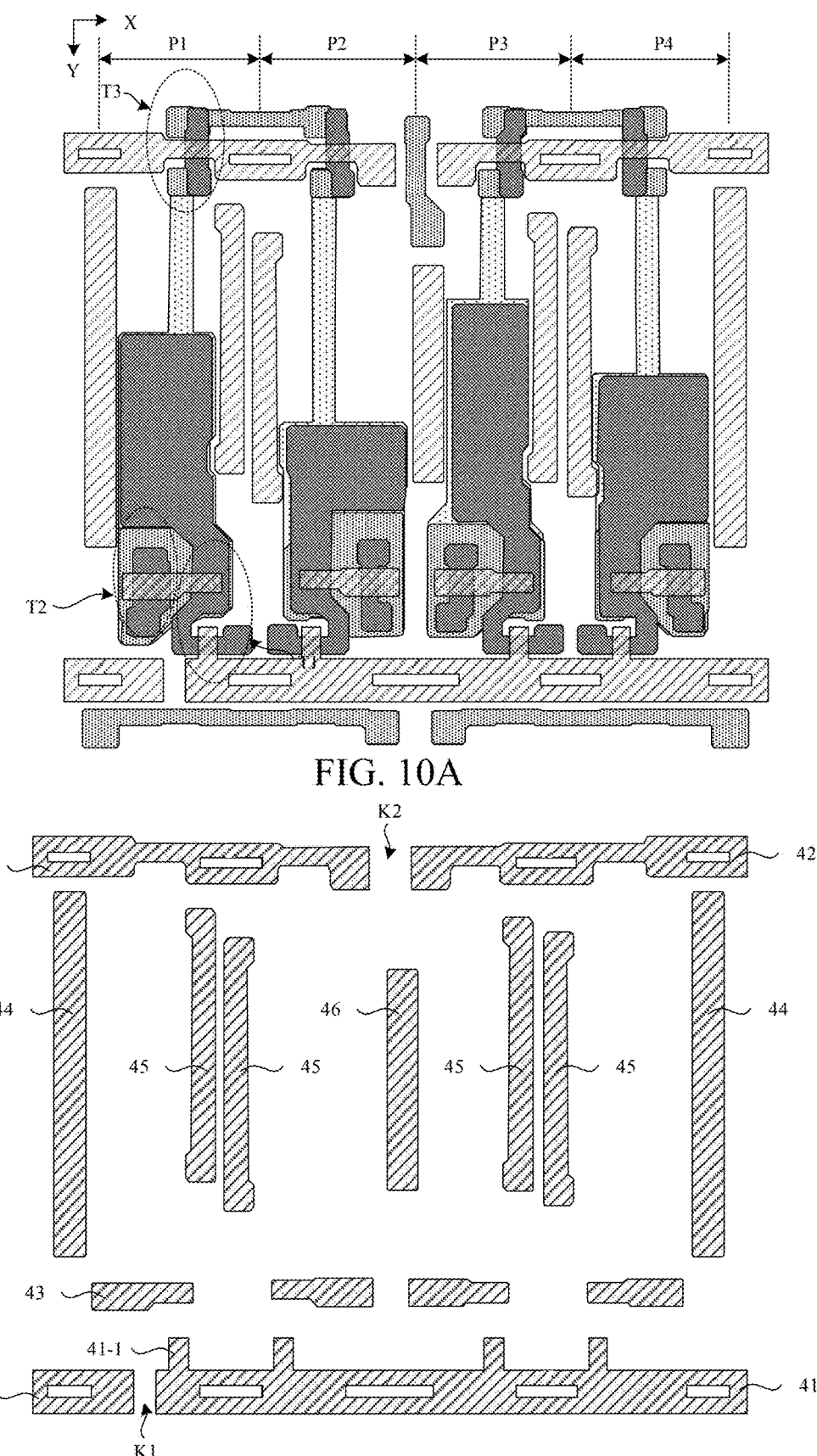
FIGS. 10A and 10B are schematic diagrams after a pattern of a second conductive layer is formed according to an embodiment of the present disclosure.

(14) A pattern of a second conductive layer is formed. In an exemplary implementation, forming the pattern of the second conductive layer may include sequentially depositing a second insulation thin film and a second conductive thin film on the base substrate on which the above-mentioned patterns are formed, patterning the second conductive thin film using a patterning process to form a second insulation layer covering the semiconductor layer, and form the pattern of the second conductive layer disposed on the second insulation layer, as shown in FIGS. 10A and 10B, wherein FIG. 10B is a schematic plan view of the second conductive layer in FIG. 10A. In an exemplary implementation, the second conductive layer may be referred to as a gate metal (GATE) layer.

In an exemplary implementation, a pattern of a second conductive layer in each pixel unit may at least include a first scan signal line 41, a second scan signal line 42, a second gate electrode 43, an auxiliary power supply line 44, an auxiliary data line 45, and an auxiliary compensation line 46.

In an exemplary implementation, a shape of the first scan signal line 41 may be a strip shape extending along the first direction X, and the first scan signal line 41 may be located at a side of the second plate 34 in the second direction Y. A first gate electrode 41-1 is provided on a first scan signal line 41 of each sub-pixel, the first gate electrode 41-1 serves as a gate electrode of a first transistor T1, and an orthographic projection of the first gate electrode 41-1 on the base substrate is at least partially overlapped with an orthographic projection of the first active layer 31 on the base substrate.

In an exemplary implementation, the first scan signal line 41 may be provided with an equal width, and the width of the first scan signal line 41 is a dimension in the second direction Y. A plurality of through holes may be provided on the first scan signal line 41, and a shape of a through hole may be a strip shape extending along the first direction X. Orthographic projections of the plurality of through holes on the base substrate at least partially overlap with orthographic projections of a first power supply line, a data signal line and a compensation signal line to be formed subsequently on the base substrate, and the plurality of through holes are configured to reduce parasitic capacitance between the first scan signal line 41 and the first power supply line, the data signal line and the compensation signal line.

In an exemplary implementation, a shape of the second scan signal line 42 may be a strip shape extending along the first direction X, and the second scan signal line 42 may be located at a side of the second plate 34 away from the first scan signal line 41. An orthographic projection of the second scan signal line 42 on the base substrate is at least partially overlapped with an orthographic projection of the third active layer 33 in each sub-pixel on the base substrate, and the second scan signal line 42 in an overlapping region may serve as a gate electrode of the third transistor T3.

In an exemplary implementation, the second scan signal line 42 may be provided with unequal widths, and a width is a dimension of the second scan signal line 42 in the second direction Y. The second scan signal line 42 includes a region overlapped with the third active layer 33 and a region not overlapped with the third active layer 33. A width of the second scan signal line 42 in the region overlapped with the third active layer 33 may be smaller than a width of the second scan signal line 42 in the region not overlapped with the third active layer 33. In the region not overlapped with the third active layer 33, a plurality of through holes may be provided on the second scan signal line 42, and shapes of the plurality of through holes may be strip shapes extending along the first direction X. Orthographic projections of the plurality of through holes on the base substrate are at least partially overlapped with orthographic projections of a first power supply line, a data signal line, and a compensation signal line to be formed subsequently on the base substrate, and the plurality of through holes are configured to reduce parasitic capacitances between the second scan signal line 42, and the first power supply line, the data signal line, and the compensation signal line.

In an exemplary implementation, the first scan signal lines 41 and the second scan signal lines 42 may be arranged in parallel.

In an exemplary implementation, both the first scan signal line 41 and the second scan signal line 42 are discontinuously arranged, and in at least one sub-pixel, at least one first notch K1 is provided on the first scan signal line 41, and at least one second notch K2 is provided on the second scan signal line 42.

In an exemplary implementation, at least one first notch K1 may be provided at any one or more of following positions: in a first sub-pixel P1, in a second sub-pixel P2, in a third sub-pixel P3, in a fourth sub-pixel P4, and between adjacent sub-pixels. At least one second notch K2 may be arranged at any one or more of following positions: in a first sub-pixel P1, in a second sub-pixel P2, in a third sub-pixel P3, in a fourth sub-pixel P4, and between adjacent sub-pixels.

In an exemplary implementation, at least one first notch K1 may be provided in the first sub-pixel P1, and the first notch K1 cuts off the first scan signal line 41 to form the first scan signal line 41 with a discontinuous structure. In an exemplary implementation, first scan signal lines 41 on two sides of the first notch K1 may be connected to each other through a first signal connection electrode to be formed subsequently to achieve transmission of a first scan signal.

In an exemplary implementation, at least one second notch K2 may be provided between the second sub-pixel P2 and the third sub-pixel P3, and the second notch K2 cuts off the second scan signal line 42 to form the second scan signal line 42 with a discontinuous structure. In an exemplary implementation, second scan signal lines 42 on two sides of the second notch K2 may be connected to each other through a second signal connection electrode to be formed subsequently to achieve transmission of a second scan signal.

In an exemplary implementation, the compensation connection electrode 83 may be arranged within the second notch K2, and an orthographic projection of the compensation connection electrode 83 on the base substrate is at least partially overlapped with an orthographic projection of the second notch K2 on the base substrate.

In an exemplary implementation, a shape of the second gate electrode 43 may be a strip shape extending along the first direction X, and the second gate electrode 43 may serve as a gate electrode of a second transistor T2. Within each sub-pixel, on the one hand, an orthographic projection of the second gate electrode 43 on the base substrate is at least partially overlapped with an orthographic projection of the second active layer 32 on the base substrate, and on the other hand, the orthographic projection of the second gate electrode 43 on the base substrate is at least partially overlapped with the second region 31-2 of the first active layer 31.

In an exemplary implementation, a shape of the auxiliary power supply line 44 may be a stripe shape extending along the second direction Y and the auxiliary power supply lines 44 may be arranged within the first sub-pixel P1 and the fourth sub-pixel P4 respectively. Within the first sub-pixel P1, the auxiliary power supply line 44 is located at a side of the second plate 34 in the opposite direction of the first direction X. Within the fourth sub-pixel P4, the auxiliary power supply line 44 is located at a side of the second plate 34 in the first direction X. The auxiliary power supply line 44 is configured to be connected to a first power supply line to be formed subsequently to form a double-layer wiring to ensure reliability of transmission of a power supply signal and to reduce a resistance of the first power supply line.

In an exemplary implementation, a shape of the auxiliary data line 45 may be a strip shape extending along the second direction Y and the auxiliary data line 45 may be respectively arranged within each sub-pixel. Within the first sub-pixel P1 and the third sub-pixel P3, auxiliary data lines 45 are located at a side of the second plate 34 in the first direction X. Within the second sub-pixel P2 and the fourth sub-pixel P4, auxiliary data lines 45 are located at a side of the second plate 34 in the opposite direction of the first direction X. The auxiliary data line 45 is configured to be connected to a data signal line to be formed subsequently to form a double-layer wiring to ensure reliability of transmission of a data signal and to reduce a resistance of the data signal line.

In an exemplary implementation, a shape of the auxiliary compensation line 46 may be a stripe shape extending along the second direction Y and the auxiliary compensation line 46 may be arranged between the second sub-pixel P2 and the third sub-pixel P3. The auxiliary compensation line 46 is configured to be connected to a compensation signal line to be formed subsequently to form a double-layer wiring to ensure reliability of transmission of a compensation signal and to reduce a resistance of the compensation signal line.

In an exemplary implementation, main body portions of the auxiliary power supply line 44, the auxiliary data line 45, and the auxiliary compensation line 46 may be arranged in parallel.

In an exemplary implementation, second gate electrodes 43 in the first sub-pixel P1 and the fourth sub-pixel P4 may be mirror-symmetrically arranged with respect to the auxiliary compensation line 46, and second gate electrodes 43 in the second sub-pixel P2 and the third sub-pixel P3 may be mirror-symmetrically arranged with respect to the auxiliary compensation line 46.

In an exemplary implementation, auxiliary power supply lines 44 in the first sub-pixel P1 and the fourth sub-pixel P4 may be mirror-symmetrically arranged with respect to the auxiliary compensation line 46, and the second scan signal line 42 may be mirror-symmetrically arranged with respect to the auxiliary compensation line 46.

In an exemplary implementation, this process further includes a conductive treatment. The conductive treatment is to perform a plasma treatment by using the second conductive layer as a shield after the pattern of the second conductive layer is formed. The semiconductor layer shielded by the second conductive layer is used as a channel region of a transistor, and the semiconductor layer not shielded by the second conductive layer is processed into a conductive layer to form a conductive second plate and a conductive source drain region.

Figure 11:
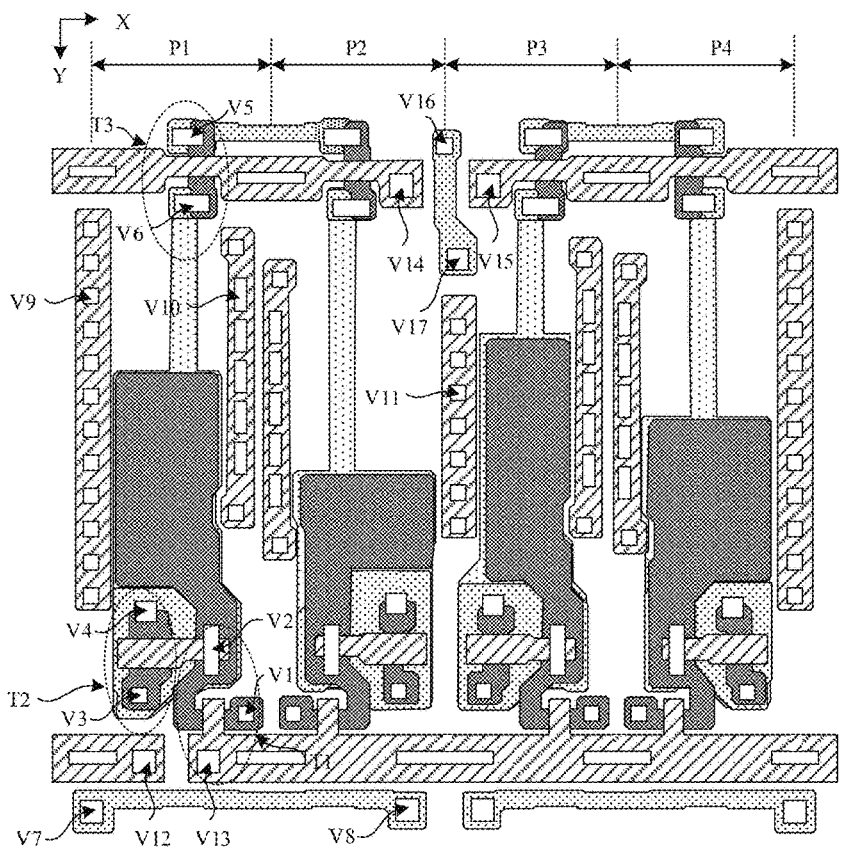
FIG. 11 is a schematic diagram after a pattern of a third insulation layer is formed according to an embodiment of the present disclosure.

(15) A pattern of a third insulation layer is formed. In an exemplary implementation, forming the pattern of the third insulation layer may include depositing a third insulation thin film on the base substrate on which the above-mentioned patterns are formed, patterning the third insulation thin film using a patterning process to form the third insulation layer covering the second conductive layer, wherein a plurality of vias are provided on the third insulation layer, as shown in FIG. 11.

In an exemplary implementation, the plurality of vias at least include: a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, a fifteenth via V15, a sixteenth via V16 and a seventeenth via V17.

In an exemplary implementation, a first via V1 may be provided in each sub-pixel, and an orthographic projection of the first via V1 on the base substrate is within an orthographic projection of a first region of a first active layer on the base substrate. The third insulation layer and the second insulation layer within the first via V1 are etched away to expose a surface of the first region of the first active layer, and the first via V1 is configured such that a data signal line to be formed subsequently is connected to the first region of the first active layer through the first via V1.

In an exemplary implementation, a second via V2 may be provided in each sub-pixel, an orthographic projection of the second via V2 on the base substrate is within an orthographic projection of a second region of the first active layer on the base substrate, and the orthographic projection of the second via V2 on the base substrate is at least partially overlapped with the orthographic projection of the second gate electrode 43 on the base substrate. The third insulation layer and the second insulation layer within the second via V2 are etched away, simultaneously exposing a surface of the second region of the first active layer and a surface of the second gate electrode 43. The second via V2 is a transfer via composed of two half holes, wherein one half hole is formed on the second region of the first active layer, and the other half hole is formed on the second gate electrode 43, so that the transfer via composed of two half holes exposes the surface of the second region of the first active layer and the surface of the second gate electrode 43 simultaneously. In an exemplary implementation, the second via V2 is configured such that a first connection electrode to be formed subsequently is connected to the second gate electrode 43 and the second region of the first active layer simultaneously through the second via V2.

In an exemplary implementation, a third via V3 may be provided in each sub-pixel, and an orthographic projection of the third via V3 on the base substrate is within an orthographic projection of a first region of a second active layer on the base substrate. The third insulation layer and the second insulation layer within the third via V3 are etched away to expose a surface of the first region of the second active layer, and the third via V3 is configured such that a first power supply line and a sixth connection electrode to be formed subsequently is connected to the first region of the second active layer through the third via V3.

In an exemplary implementation, a fourth via V4 may be provided in each sub-pixel. On the one hand, an orthographic projection of the fourth via V4 on the base substrate is at least partially overlapped with an orthographic projection of a second region of the second active layer on the base substrate. On the other hand, the orthographic projection of the fourth via V4 on the base substrate is at least partially overlapped with the orthographic projection of the shield layer 23 on the base substrate. The fourth via V4 is a transfer via. The third insulation layer, the second insulation layer, and the first insulation layer within the fourth via V4 are etched away to simultaneously expose a surface of the second region of the second active layer and a surface of the shield layer 23, and the fourth via V4 is configured such that a second connection electrode to be formed subsequently is connected to the second region of the second active layer and the shield layer 23 simultaneously through the via.

In an exemplary implementation, a fifth via V5 may be provided in each sub-pixel, on the one hand, an orthographic projection of the fifth via V5 on the base substrate is at least partially overlapped with an orthographic projection of a first region of a third active layer on the base substrate, and on the other hand, the orthographic projection of the fifth via V5 on the base substrate is at least partially overlapped with the orthographic projection of the compensation connection line 22 on the base substrate. The fifth via V5 is a transfer via. The third insulation layer, the second insulation layer, and the first insulation layer within the fifth via V5 are etched away to simultaneously expose a surface of the first region of the third active layer and a surface of the compensation connection line 22, and the fifth via V5 is configured such that a fourth connection electrode to be formed subsequently is connected to the compensation connection line 22 and the first region of the third active layer simultaneously through the fifth via V5.

In an exemplary implementation, a sixth via V6 may be provided in each sub-pixel, on the one hand, an orthographic projection of the sixth via V6 on the base substrate is at least partially overlapped with an orthographic projection of a second region of the third active layer on the base substrate, and on the other hand, the orthographic projection of the sixth via V6 on the base substrate is at least partially overlapped with the orthographic projection of the interlayer connection electrode 24 on the base substrate. The sixth via V6 is a transfer via. The third insulation layer, the second insulation layer, and the first insulation layer within the sixth via V6 are etched away to simultaneously expose a surface of the second region of the third active layer and a surface of the interlayer connection electrode 24, and the sixth via V6 is configured such that a third connection electrode to be formed subsequently is connected to the interlayer connection electrode 24 and the second region of the third active layer simultaneously through the via.

In an exemplary implementation, the seventh via V7 may be provided in the first sub-pixel P1 and the fourth sub-pixel P4, the orthographic projection of the seventh via V7 on the base substrate is within the orthographic projection of a first end of the power supply connection line 21 on the base substrate. The third insulation layer, the second insulation layer, and the first insulation layer in the seventh via V7 are etched away to expose the surface of the first end of the power supply connection line 21, and the seventh via V7 is configured such that a first power supply line to be formed subsequently is connected to the first end of the power supply connection line 21 through the seventh via V7.

In an exemplary implementation, the eighth via V8 may be provided in the second sub-pixel P2 and the third sub-pixel P3, and an orthographic projection of the eighth via V8 on the base substrate is within an orthographic projection of the second end of the power supply connection line 21 on the base substrate. The third insulation layer, the second insulation layer, and the first insulation layer within the eighth via V8 are etched away to expose a surface of the second end of the power supply connection line 21, and the eighth via V8 is configured such that a sixth connection electrode to be formed subsequently is connected to the second end of the power supply connection line 21 through the eighth via V8.

In an exemplary implementation, the ninth via V9 may be provided in the first sub-pixel P1 and the fourth sub-pixel P4, and an orthographic projection of the ninth via V9 on the base substrate is within an orthographic projection of the auxiliary power supply line 44 on the base substrate. The third insulation layer within the ninth via V9 is etched away to expose a surface of the auxiliary power supply line 44, and the ninth via V9 is configured such that the first power supply line to be formed subsequently is connected to the auxiliary power supply line 44 through the ninth via V9. In an exemplary implementation, a plurality of ninth vias V9 may be provided, and the plurality of ninth vias V9 may be sequentially arranged along the second direction Y to increase reliability of a connection between the first power supply line and the auxiliary power supply line 44.

In an exemplary implementation, a tenth via V10 may be provided in each sub-pixel, and an orthographic projection of the tenth via V10 on the base substrate is within an orthographic projection of the auxiliary data line 45 on the base substrate. The third insulation layer in the tenth via V10 is etched away to expose a surface of the auxiliary data line 45, and the tenth via V10 is configured such that a data signal line to be formed subsequently is connected to the auxiliary data line 45 through the tenth via V10. In an exemplary implementation, a plurality of tenth vias V10 may be provided, and the plurality of tenth vias V10 may be sequentially arranged along the second direction Y to increase reliability of a connection between the data signal line and the auxiliary data line 45.

In an exemplary implementation, the eleventh via V11 may be provided between the second sub-pixel P2 and the third sub-pixel P3, and an orthographic projection of the eleventh via V11 on the base substrate is within an orthographic projection of the auxiliary compensation line 46 on the base substrate. The third insulation layer within the eleventh via V11 is etched away to expose a surface of the auxiliary compensation line 46, and the eleventh via V11 is configured such that the compensation signal line to be formed subsequently is connected to the auxiliary compensation line 46 through the eleventh via V11. In an exemplary implementation, a plurality of eleventh vias V11 may be provided, and the plurality of eleventh vias V11 may be sequentially arranged along the second direction Y to increase reliability of a connection between the compensation signal line and the auxiliary compensation line 46.

In an exemplary implementation, the twelfth via V12 and the thirteenth via V13 may be provided in the first sub-pixel P1, an orthographic projection of the twelfth via V12 on the base substrate may be within an orthographic projection of a first scan signal line 41 at a side of the first notch K on the base substrate, and an orthographic projection of the thirteenth via V13 on the base substrate may be within an orthographic projection of a first scan signal line 41 at the other side of the first notch K1 on the base substrate. The third insulation layers within the twelfth via V12 and the thirteenth via V13 are etched away to expose surfaces of first scan signal lines 41 on two sides of the first notch K1 respectively, and the twelfth via V12 and the thirteenth via V13 are configured such that the first signal connection electrode to be formed subsequently is connected to the first scan signal lines 41 on the two sides of the first notch K1 through the twelfth via V12 and the thirteenth via V13 respectively.

In an exemplary implementation, the fourteenth via V14 may be provided in the second sub-pixel P2, and the fifteenth via V15 may be provided in the third sub-pixel P3. An orthographic projection of the fourteenth via V14 on the base substrate may be within an orthographic projection of a second scan signal line 42 at a side of the second notch K2 on the base substrate, and an orthographic projection of the fifteenth via V15 on the base substrate may be within an orthographic projection of a second scan signal line 42 on the other side of the second notch K2 on the base substrate. The third insulation layer within the fourteenth via V14 and the fifteenth via V15 is etched away to expose surfaces of second scan signal lines 42 on two sides of the second notch K2 respectively, and the fourteenth via V14 and the fifteenth via V15 are configured such that a second signal connection electrode to be formed subsequently is connected to the second scan signal lines 42 on two sides of the second notch K2 through the fourteenth via V14 and the fifteenth via V15 respectively.

In an exemplary implementation, the sixteenth via V16 may be provided between the second sub-pixel P2 and the third sub-pixel P3, an orthographic projection of the sixteenth via V16 on the base substrate may be within an orthographic projection of a first end of the compensation connection electrode 83 on the base substrate. The third insulation layer, the second insulation layer, and the first insulation layer within the sixteenth via V16 are etched away to expose a surface of the first end of the compensation connection electrode 83, and the sixteenth via V16 is configured such that the compensation signal line to be formed subsequently is connected to the first end of the compensation connection electrode 83 through the sixteenth via V16.

In an exemplary implementation, the seventeenth via V17 may be provided between the second sub-pixel P2 and the third sub-pixel P3, an orthographic projection of the seventeenth via V17 on the base substrate may be within an orthographic projection of a second end of the compensation connection electrode 83 on the base substrate. The third insulation layer, the second insulation layer, and the first insulation layer within the seventeenth via V17 are etched away to expose a surface of the second end of the compensation connection electrode 83, and the seventeenth via V17 is configured such that the compensation signal line to be formed subsequently is connected to the second end of the compensation connection electrode 83 through the seventeenth via V17.

Figure 12A:
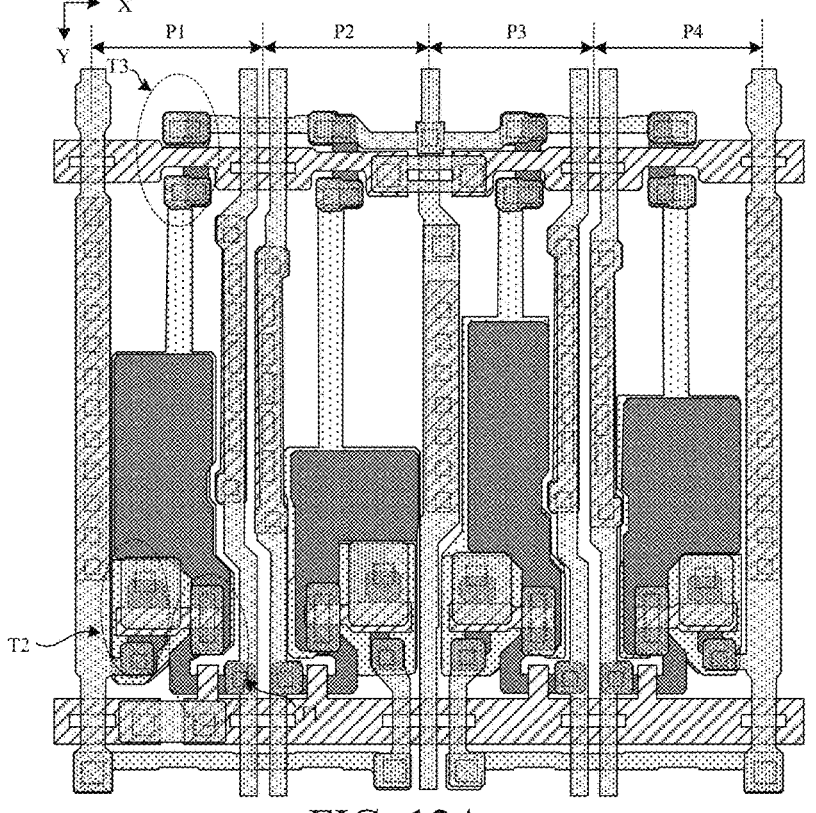
FIGS. 12A and 12B are schematic diagrams after a pattern of a third conductive layer is formed according to an embodiment of the present disclosure.
Figure 12B:
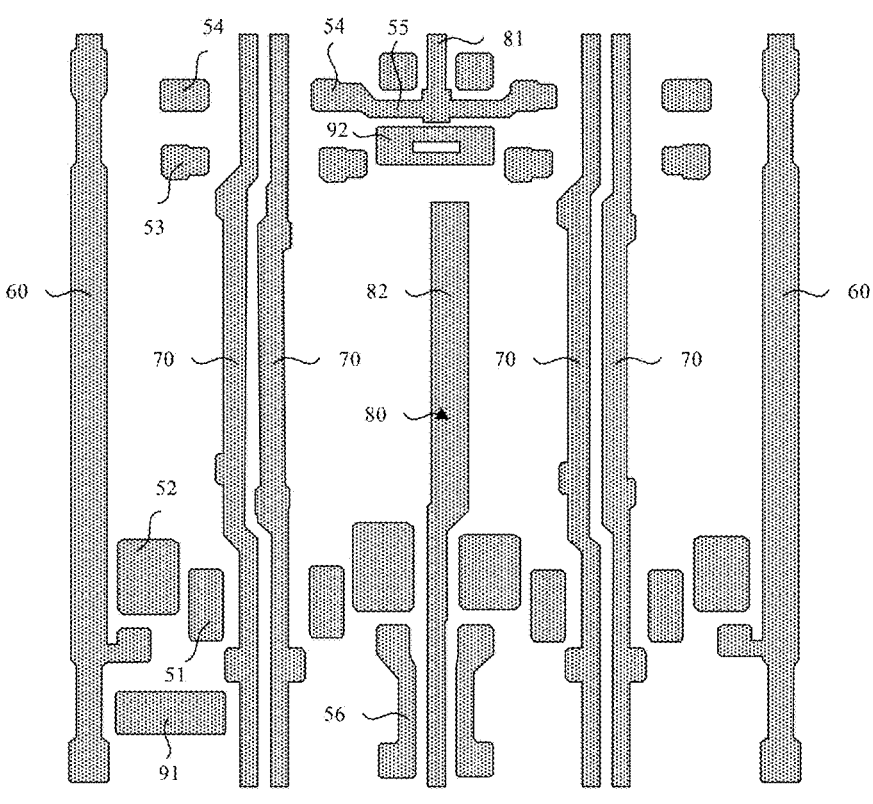

(16) A pattern of a third conductive layer is formed. In an exemplary implementation, forming the pattern of the third conductive layer may include: depositing a third conductive thin film on the base substrate on which the aforementioned patterns are formed, and patterning the third conductive thin film through a patterning process to form the third conductive layer arranged on the third insulation layer, as shown in FIG. 12A and FIG. 12B, wherein FIG. 12B is a schematic plan view of the third conductive layer in FIG. 12A. In an exemplary implementation, the third conductive layer may be referred to as a source-drain metal (SD) layer.

In an exemplary implementation, a pattern of a third conductive layer in each pixel unit at least includes a first connection electrode 51, a second connection electrode 52, a third connection electrode 53, a fourth connection electrode 54, a fifth connection electrode 55, a sixth connection electrode 56, a first power supply line 60, a data signal line 70, a compensation signal line 80, a first signal connection electrode 91, and a second signal connection electrode 92.

In the exemplary embodiment, the first power supply line 60 may be provided in the first sub-pixel P1 and the fourth sub-pixel P4 respectively, and a shape of the first power supply line 60 may be a linear shape whose main body portion extends along the second direction Y. On the one hand, the first power supply line 60 is connected to the first region of the second active layer through the third via V3 to achieve that a power supply signal is written into the second transistor T2. On another hand, the first power supply line 60 is connected to the first end of the power supply connection line 21 through the seventh via V7, and the first power supply line 60 transmits a power supply signal to the power supply connection line 21, so that the first power supply line 60 in the first sub-pixel P1 can transmit a power supply signal to the second sub-pixel P2 through the power supply connection line 21, and the first power supply line 60 in the fourth sub-pixel P4 can transmit a power supply signal to the third sub-pixel P3 through the power supply connection line 21. On another hand, the first power supply line 60 is connected to the auxiliary power supply line 44 through the plurality of ninth vias V9, so that the first power supply line 60 and the auxiliary power supply line 44 form a double-layer wiring.

In an exemplary implementation, the first power supply line 60 may be a straight line or a polyline with an equal width, or a straight line or a polyline with unequal widths, and using a straight line or a polyline with a variable width may not only facilitate a layout of a pixel structure, but also reduce a parasitic capacitance.

In the exemplary embodiment, data signal lines 70 are respectively provided in each sub-pixel, and a shape of a data signal line 70 may be a linear shape with a main portion extending along the second direction Y. On the one hand, the data signal line 70 is connected to the first region of the first active layer through a first via V1, so that the data signal is written to the first transistor T1. On another hand, the data signal line 70 is connected to the auxiliary data line 45 through a plurality of tenth vias V10, so that the data signal line 70 and the auxiliary data line 45 form a double-layer wiring.

In an exemplary implementation, the data signal line 70 may be a straight line or a polyline with an equal width, or a straight line or a polyline with unequal widths, and using a straight line or a polyline provided with a variable width may not only facilitate a layout of a pixel structure, but also reduce a parasitic capacitance.

In an exemplary implementation, the compensation signal line 80 may be arranged between the second sub-pixel P2 and the third sub-pixel P3, and the compensation signal line 80 may include a first compensation signal line 81 and a second compensation signal line 82. The first compensation signal line 81 and the second compensation signal line 82 may be respectively arranged on two sides of the second signal connection electrode 92 in the second direction Y.

Shapes of the first compensation signal line 81 and the second compensation signal line 82 may be strip shapes whose main body portions extend along the second direction Y, so that compensation signal lines arranged at intervals are formed.

In an exemplary implementation, the first compensation signal line 81 is connected to the first end of the compensation connection electrode 83 through the sixteenth via V16, and the second compensation signal line 82 is connected to the second end of the compensation connection electrode 83 through the seventeenth via V17, so that the first compensation signal line 81 and the second compensation signal line 82 on two sides of the second signal connection electrode 92 are connected to each other through the compensation connection electrode 83.

In an exemplary implementation, the second compensation signal line 82 may also be connected to the auxiliary compensation line 46 through the plurality of eleventh vias V11, such that the second compensation signal line 82 and the auxiliary compensation line 46 form a double-layer wiring.

In an exemplary implementation, the first compensation signal line 81 and the second compensation signal line 82 may be straight lines or polylines with an equal width, or straight lines or polylines with unequal widths, and using a straight line or a polyline with a variable width may not only facilitate a layout of a pixel structure, but also reduce a parasitic capacitance.

In an exemplary implementation, a shape of the first connection electrode 51 may be a rectangular shape and a first connection electrode 51 may be arranged in each sub-pixel respectively, and the first connection electrode 51 in each sub-pixel is connected to the second region of the first active layer and the second gate electrode simultaneously through the second via V2. In an exemplary implementation, the first connection electrode 51 may serve as a second electrode of a first transistor T1, and since the second region of the first active layer is connected to the second plate 34, the first connection electrode 51 enables the second electrode of the first transistor T1, the second gate electrode 43, and the second plate 34 to have a same potential, i.e., a potential of a first node N1 in a pixel drive circuit.

In an exemplary implementation, a shape of the second connection electrode 52 may be a rectangular shape and a second connection electrode 52 may be respectively arranged in each sub-pixel, and the second connection electrode 52 in each sub-pixel is connected to the second region of the second active layer and the shield layer 23 simultaneously through the fourth via V4. In an exemplary implementation, the second connection electrode 52 may serve as a second electrode of a second transistor T2, and since the shield layer 23 is connected to the connection plate 12 and the connection plate 12 is connected to the first plate 11, the second connection electrode 52 enables the second electrode of the second transistor T2 and the first plate 11 of the storage capacitor to have a same potential.

In an exemplary implementation, a shape of the third connection electrode 53 may be a rectangular shape, and a third connection electrode 53 may be respectively arranged in each sub-pixel, and the third connection electrode 53 in each sub-pixel is connected to the second region of the third active layer and the interlayer connection electrode simultaneously through the sixth via V6. In an exemplary implementation, the third connection electrode 53 may serve as a second electrode of a third transistor T3, and since the interlayer connection electrode 24 is connected to the connection line 13 and the connection line 13 is connected to the first plate 11, the third connection electrode 53 enables the second electrode of the third transistor T3 and the first plate 11 of the storage capacitor to have a same potential.

In an exemplary implementation, since the second connection electrode 52 enables the first plate 11 and the second electrode of the second transistor T2 to have a same potential, the third connection electrode 53 enables the first plate 11 and the second electrode of the third transistor T3 to have a same potential, so that the second connection electrode 52 and the third connection electrode 53 enable the second electrode of the second transistor T2, the second electrode of the third transistor T3, and the first plate 11 to have a same potential, i.e., a potential of a second node N2 in the pixel drive circuit.

In an exemplary implementation, a shape of the fourth connection electrode 54 may be a rectangular shape and a fourth connection electrode 54 may be respectively arranged in each sub-pixel, and the fourth connection electrode 54 in each sub-pixel is connected to the first region of the third active layer and the compensation connection line 22 simultaneously through the fifth via V5 of the sub-pixel. In an exemplary implementation, the fourth connection electrode 54 may serve as a first electrode of a third transistor T3, and since the compensation connection line 22 is connected to the first compensation signal line 81, the fourth connection electrode 54 can write a compensation signal into the first electrode of the third transistor T3 of each sub-pixel.

In an exemplary implementation, a shape of the fifth connection electrode 55 may be a strip shape extending along the first direction X and fifth connection electrodes 55 may be arranged in the second sub-pixel P2 and the third sub-pixel P3, respectively. A first end of a fifth connection electrode 55 is connected to the first compensation signal line 81, and a second end of the fifth connection electrode 55 extends to the second sub-pixel P2 along the opposite direction of the first direction X or extends to the third sub-pixel P3 along the first direction X and is connected to a fourth connection electrode 54 of a sub-pixel where the fifth connection electrode 55 is located. In an exemplary implementation, the fifth connection electrode 55 may serve as an auxiliary connection line, and since the fifth connection electrode 55 is connected to the first compensation signal line 81, the fourth connection electrode 54 is connected to the fifth connection electrode 55, and the compensation connection line 22 is connected to the fourth connection electrode 54, a connection between the compensation connection line 22 and the first compensation signal line 81 is achieved, and the first compensation signal line 81 transmits a compensation signal to the compensation connection line 22.

In an exemplary implementation, the first compensation signal line 81, the fourth connection electrode 54, and the fifth connection electrode 55 in the second sub-pixel P2 and the third sub-pixel P3 may be connected to each other into an integral structure.

In an exemplary implementation, a shape of the sixth connection electrode 56 may be a strip shape extending along the second direction Y and sixth connection electrodes 56 may be arranged in the second sub-pixel P2 and the third sub-pixel P3, respectively. A first end of a sixth connection electrode 56 is connected to the power supply connection line 21 through the eighth via V8, and a second end of the sixth connection electrode 56 is connected to the first region of the second active layer through the third via V3 of the sub-pixel. In an exemplary implementation, the sixth connection electrode 56 may serve as the first electrode of the second transistor T2, and since the power supply connection line 21 is connected to the first power supply line 60, the sixth connection electrode 56 may write a power supply signal to first electrodes of second transistors T2 of the second sub-pixel P2 and the third sub-pixel P3.

In an exemplary implementation, a shape of the first signal connection electrode 91 may be a strip shape extending along the first direction X and the first signal connection electrode 91 may be arranged in the first sub-pixel P1. A first end of the first signal connection electrode 91 is connected to a first scan signal line 41 located at a side of the first notch K1 through the twelfth via V12, and a second end of the first signal connection electrode 91 is connected to a first scan signal line 41 located on the other side of the first notch K1 through the thirteenth via V13, so that first scan signal lines 41 on the two sides of the first notch K1 are connected to each other through the first signal connection electrode 91.

In an exemplary implementation, a shape of the second signal connection electrode 92 may be a strip shape extending along the first direction X and the second signal connection electrode 92 may be arranged between the second sub-pixel P2 and the third sub-pixel P3. A first end of the second signal connection electrode 92 is connected to a second scan signal line 42 at a side of the second notch K2 through the fourteenth via V14, a second end of the second signal connection electrode 92 is connected to a second scan signal line 42 on the other side of the second notch K2 through the fifteenth via V15, so that second scan signal lines 42 on the two sides of the second notch K2 are connected to each other through the second signal connection electrode 92.

In an exemplary implementation, at least one through hole may be provided on the second signal connection electrode 92, and an orthographic projection of the at least one through hole on the base substrate and a through hole of the compensation connection electrode 83 are configured to reduce a parasitic capacitance between the second signal connection electrode 92 and the compensation connection electrode 83, that is, to reduce a parasitic capacitance between a second scan signal line and a compensation signal line.

According to the exemplary embodiment of the present disclosure, by providing a data signal line 70 extending along the second direction Y in each sub-pixel, the data signal line 70 is connected to a first transistor T1 of the present sub-pixel through a via, and so that the data signal line 70 of each sub-pixel can write a data signal into the first electrode of the first transistor T1 in the present sub-pixel.

According to the exemplary implementation of the present disclosure, it is achieved that power supply signals are written into second transistors T2 of four sub-pixels respectively by providing two first power supply lines 60 extending along the second direction Y and two power supply connection lines 21 extending along the first direction X in a pixel unit. Among them, in the first sub-pixel P1 and the fourth sub-pixel P4, the first power supply lines 60 are directly connected to first electrodes of second transistors T2 through vias, respectively. In the second sub-pixel P2 and the third sub-pixel P3, the first power supply lines 60 are connected to first electrodes of second transistors T2 through sixth connection electrodes 56 respectively.

According to the exemplary implementation of the present disclosure, it is achieved that compensation signals are written into third transistors T3 of four sub-pixels respectively by providing one compensation signal line 81 whose main body portion extends along the second direction Y (the first compensation signal line 81 and the second compensation signal line 82 connected through the compensation connection electrode 83) and two compensation connection lines 22 extending along the first direction X in a pixel unit. Among them, in the second sub-pixel P2 and the third sub-pixel P3, the compensation signal lines are connected to first electrodes of third transistors T3 through the fifth connection electrode 55 and the fourth connection electrode 54 respectively. In the first sub-pixel P1 and the fourth sub-pixel P4, the compensation signal lines are connected to first electrodes of third transistors T3 through the compensation connection line 22 and the fourth connection electrode 54 respectively. In the present disclosure, compensation signals are provided to four sub-pixels by disposing one compensation signal line, and it may be ensured that Resistor-Capacitor (RC) delay of the compensation signals is substantially the same before being written into the transistors, thus ensuring display uniformity.

According to the exemplary implementation of the present disclosure, at least one first notch is provided on the first scan signal line, and first scan signal lines on two sides of the first notch are connected to each other through the first signal connection electrode. Compared with a display substrate in which a continuous scan signal line is adopted, in the exemplary implementation of the present disclosure, the first scan signal line is divided into a plurality of segments, which can not only effectively reduces an amount of static electricity generated by a scan signal line in a dry etching process, but also avoids a case of breakdown of a channel of a transistor caused by static electricity accumulation, which effectively avoids occurrence of edge dark spots in a display apparatus, and improves a yield and display quality on a premise of ensuring continuous transmission of a first scan signal.

According to the exemplary implementation of the present disclosure, at least one second notch is provided on the second scan signal line, and second scan signal lines on two sides of the second notch are connected to each other through the second signal connection electrode. Compared with a display substrate in which a continuous scan signal line is adopted, in the exemplary implementation of the present disclosure, the second scan signal line is divided into a plurality of segments, which can not only effectively reduces an amount of static electricity generated by a scan signal line in a dry etching process, but also avoids a case of breakdown of a channel of a transistor caused by static electricity accumulation, which effectively avoids occurrence of edge dark spots in a display apparatus, and improves a yield and display quality on a premise of ensuring continuous transmission of a second scan signal.

According to the exemplary implementation of the present disclosure, the second notch is provided between the second sub-pixel P2 and the third sub-pixel P3, and the compensation signal line is divided into a plurality of segments, and the compensation signal lines are connected to each other through the compensation connection electrode, which effectively reduces an amount of static electricity generated by a compensation signal line in a dry etching process, and avoids a case of breakdown of a channel of a transistor caused by static electricity accumulation, which effectively avoids occurrence of edge dark spots in a display apparatus, and improves a yield and display quality on a premise of ensuring continuous transmission of a compensation signal line.

Figure 13:
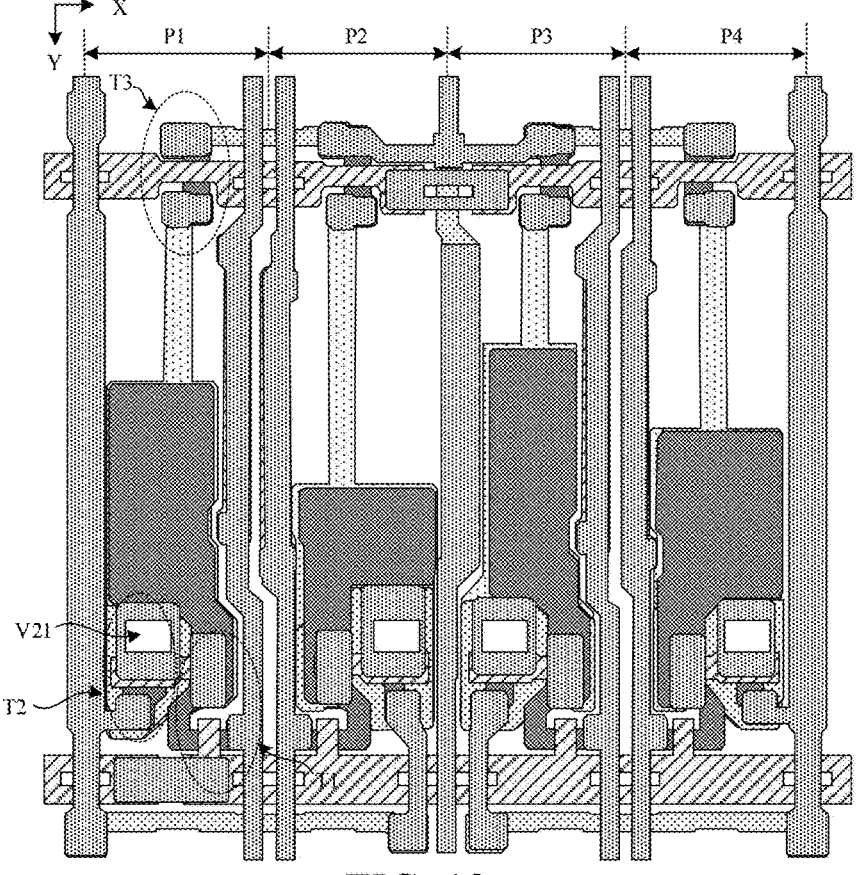
FIG. 13 is a schematic diagram after a pattern of a planarization layer is formed according to an embodiment of the present disclosure.

(17) A pattern of a planarization layer is formed. In an exemplary implementation, forming the pattern of the planarization layer may include: coating a planarization thin film on the base substrate on which the aforementioned patterns are formed, patterning the planarization thin film through a patterning process to form the pattern of the planarization layer covering the third conductive layer, wherein the planarization layer is provided with a plurality of vias, and the plurality of vias at least include a twenty-first via V21 located in each sub-pixel, as shown in FIG. 13.

In an exemplary implementation, an orthographic projection of the twenty-first via V21 on the base substrate is located within an orthographic projection of the second connection electrode 52 on the base substrate, the planarization layer in the twenty-first via V21 is removed to expose a surface of the second connection electrode 52, and the twenty-first via V21 is configured such that a first electrode to be formed subsequently is connected to the second connection electrode 52 through the twenty-first via V21.

In an exemplary implementation, the display substrate may include a fourth insulation layer and a color film layer. The fourth insulation layer is formed first on the base substrate on which the aforementioned patterns are formed, then the color film layer is formed on the fourth insulation layer, a planarization thin film is coated subsequently, and the planarization thin film and a fourth insulation thin film are patterned through a patterning process to form the fourth insulation layer covering the third conductive layer, the color film layer arranged on the fourth insulation layer, and the pattern of the planarization layer covering the color film layer, wherein a plurality of vias are provided on the planarization layer and the fourth insulation layer.

Figure 14:
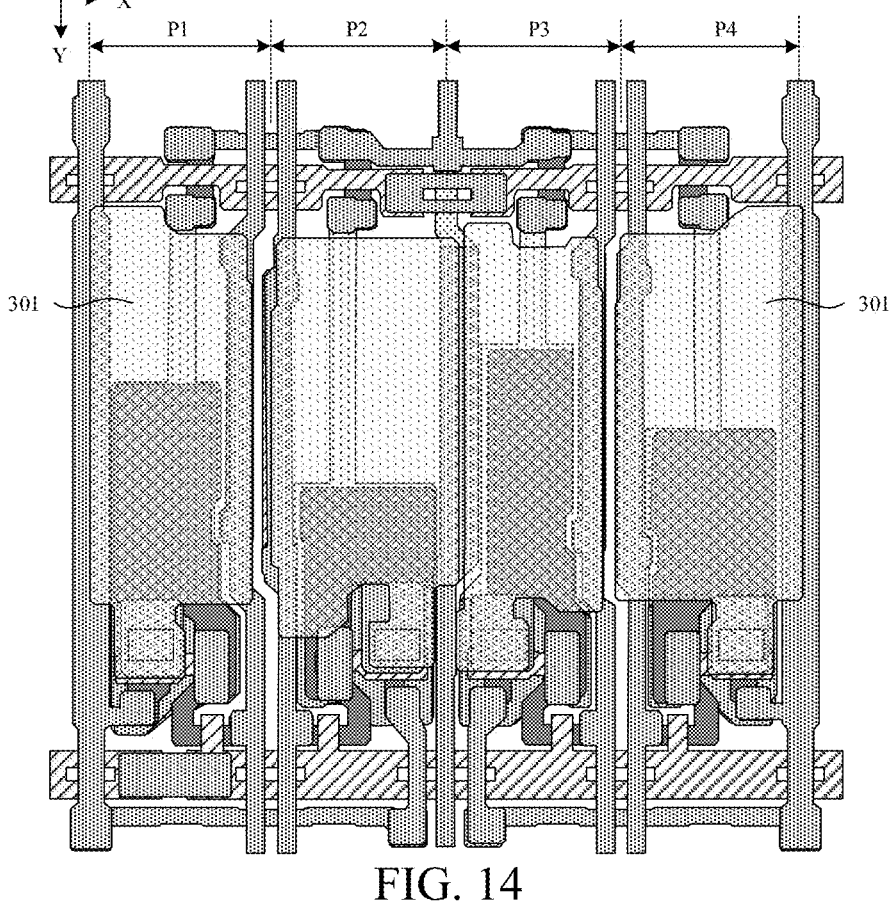
FIG. 14 is a schematic diagram after a pattern of an anode conductive layer is formed according to an embodiment of the present disclosure.

(18) A pattern of an electrode conductive layer is formed. In an exemplary implementation, forming the pattern of the electrode conductive layer may include: depositing an electrode conductive thin film on the base substrate on which the aforementioned patterns are formed, and patterning the electrode conductive thin film through a patterning process to form the pattern of the electrode conductive layer arranged on the planarization layer, wherein the pattern of the electrode conductive layer at least includes a first electrode 301 located in each sub-pixel, as shown in FIG. 14.

In an exemplary implementation, the pattern of the electrode conductive layer may include a red first electrode located in the first sub-pixel P1, a white first electrode located in the second sub-pixel P2, a blue first electrode located in the third sub-pixel P3, and a green first electrode located in the fourth sub-pixel P4, wherein a first electrode in each sub-pixel is connected to the second connection electrode 52 through the twenty-first via V21. Since the second connection electrode 52 is used as the second electrode of the second transistor T2, a connection between the first electrode 301 and the second electrode of the second transistor T2 is achieved.

In an exemplary implementation, the first electrode 301 may be in a strip shape extending along the second direction Y, and a protrusion is provided at a side of an first electrode in each sub-pixel in the second direction Y, and the protrusion is connected to the second connection electrode 52 through the twenty-first via V21.

In an exemplary implementation, an orthographic projection of a first electrode in each sub-pixel on the base substrate contains an orthographic projection of a storage capacitor in a sub-pixel where the first electrode is located on the base substrate.

Figure 15:
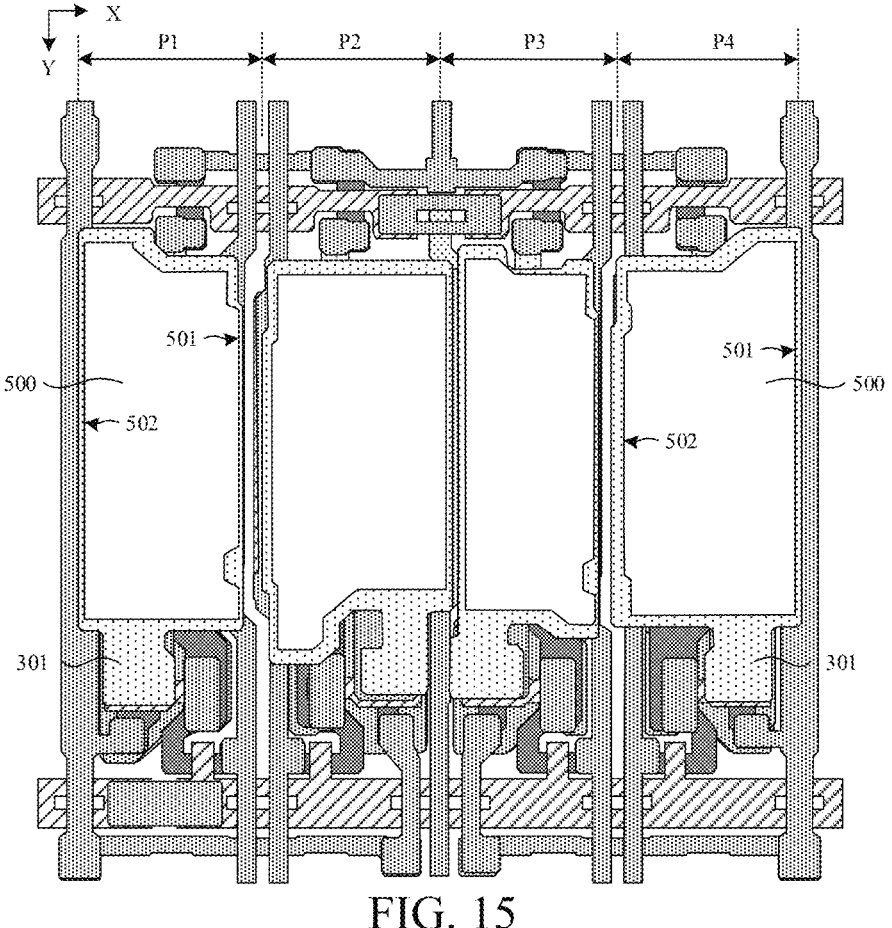
FIG. 15 is a schematic diagram after a pattern of a pixel define layer is formed according to an exemplary embodiment of the present disclosure.

(19) A pattern of a pixel define layer is formed. In an exemplary implementation, forming the pattern of the pixel define layer may include: coating a pixel define thin film on the base substrate on which the aforementioned patterns are formed, and patterning the pixel define thin film through a patterning process to form the pattern of the pixel define layer, and the pattern of the pixel define layer at least includes a pixel opening 500 located in each sub-pixel, as shown in FIG. 15.

In an exemplary implementation, shapes and areas of pixel openings 500 of different sub-pixels may be different. In the exemplary embodiment of the present disclosure, four sub-pixels are designed to have different aperture ratios, to adapt to transmittances of color film layers of different sub-pixels, so that light emitting devices of the four sub-pixels may emit same brightness at different currents, service lives of the light emitting devices of the four sub-pixels are optimized to a maximum extent, and thereby ensuring service life of the product.

In an exemplary implementation, shapes of pixel openings of the four sub-pixels may be the same or different, and areas of the pixel openings of the four sub-pixels may be the same or different.

In an exemplary implementation, a shape of a pixel opening may include any one or more of following: a triangle, a rectangle, a trapezoid, a parallel four-frame shape, a five-frame shape, a six-frame shape, a circle, and an ellipse.

In an exemplary implementation, an orthographic projection of a pixel opening 500 in each sub-pixel on the base substrate is at least partially overlapped with an orthographic projection of a storage capacitor of the sub-pixel on the base substrate.

In an exemplary implementation, an orthographic projection of a storage capacitor in each sub-pixel on the base substrate may be within an orthographic projection of a pixel opening 500 in the sub-pixel where the storage capacitor is located on the base substrate.

Figure 16:
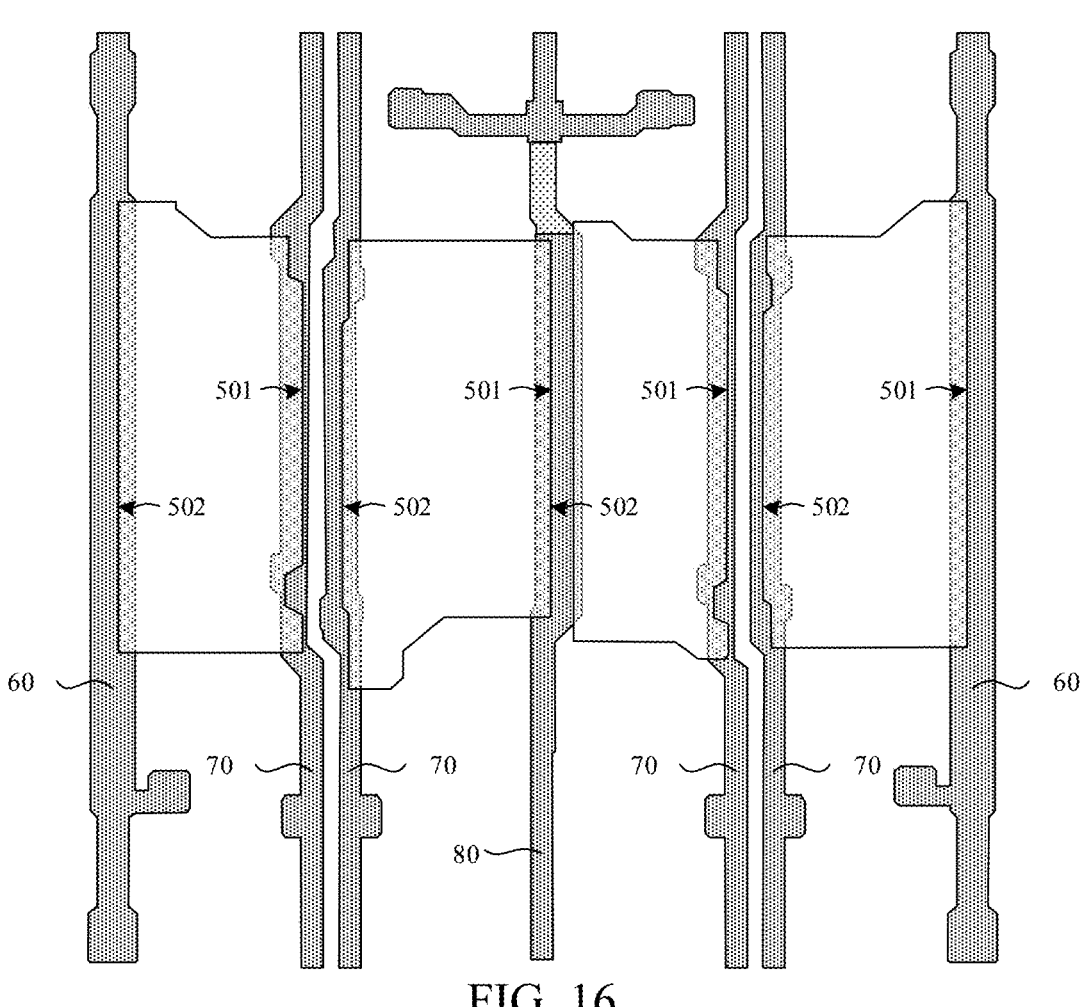
FIG. 16 is a schematic diagram of a positional relationship between pixel openings and signal lines according to an embodiment of the present disclosure.

FIG. 16 is a schematic diagram of a positional relationship between pixel openings and signal lines according to an exemplary embodiment of the present disclosure. As shown in FIG. 16, in an exemplary implementation, the pixel opening 500 of each sub-pixel at least include a first opening edge 501 located at a side in the first direction X of the pixel opening and a second opening edge 502 located at a side in the opposite direction of the first direction X of the pixel opening, and shapes of the first opening edge 501 and the second opening edge 502 may be straight lines or a polylines extending along the second direction Y.

In an exemplary implementation, in at least one sub-pixel, an orthographic projection of at least one of the first opening edge 501 and the second opening edge 502 on the base substrate is at least partially overlapped with an orthographic projection of a first power supply line 60 on the base substrate.

In an exemplary implementation, in at least one sub-pixel, the orthographic projection of at least one of the first opening edge 501 and the second opening edge 502 on the base substrate is at least partially overlapped with an orthographic projection of a data signal line 70 on the base substrate.

In an exemplary implementation, in at least one sub-pixel, the orthographic projection of at least one of the first opening edge 501 and the second opening edge 502 on the base substrate is at least partially overlapped with an orthographic projection of a compensation signal line 80 on the base substrate.

In an exemplary implementation, in the first sub-pixel P1, an orthographic projection of the first opening edge 501 on the base substrate is at least partially overlapped with the orthographic projection of the data signal line 70 on the base substrate, and an orthographic projection of the second opening edge 502 on the base substrate is at least partially overlapped with the orthographic projection of the first power supply line 60 on the base substrate.

In an exemplary implementation, in the second sub-pixel P2, an orthographic projection of the first opening edge 501 on the base substrate is at least partially overlapped with the orthographic projection of the compensation signal line 80 on the base substrate, and the orthographic projection of the second opening edge 502 on the base substrate is at least partially overlapped with the orthographic projection of the data signal line 70 on the base substrate.

In an exemplary implementation, in the third sub-pixel P3, the orthographic projection of the first opening edge 501 on the base substrate is at least partially overlapped with the orthographic projection of the data signal line 70 on the base substrate, and the orthographic projection of the second opening edge 502 on the base substrate is at least partially overlapped with the orthographic projection of the compensation signal line 80 on the base substrate.

In an exemplary implementation, in the fourth sub-pixel P4, the orthographic projection of the first opening edge 501 on the base substrate is at least partially overlapped with the orthographic projection of the first power supply line 60 on the base substrate, and the orthographic projection of the second opening edge 502 on the base substrate is at least partially overlapped with the orthographic projection of the data signal line 70 on the base substrate.

According to the present disclosure, the orthographic projection of the first opening edge of the pixel opening on the base substrate and/or the orthographic projection of the second opening edge of the pixel opening on the base substrate is set to be at least partially overlapped the orthographic projection of the first power supply line 60, the orthographic projection of the data signal line 70 or the orthographic projection of the compensation signal line 80 on the base substrate, that is, the pixel opening is pressed on the metal line, so that from a side viewing angle, the emitted light from the pixel opening is largely light rays reflected by metal lines, which effectively reduces brightness differences due to alignment difference and eliminates splicing mura.

In an exemplary implementation, a subsequent manufacturing process may include: forming an organic emitting layer using an evaporation or inkjet printing process. The organic emitting layer is connected to a first electrode through a pixel opening, and forming a second electrode on the organic emitting layer, and the second electrode is connected to the organic emitting layer. An encapsulation structure layer is formed, and the encapsulation structure layer may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer, so that it may be ensured that external moisture cannot enter a light emitting structure layer.

So far, the drive circuit layer, the light emitting structure layer arranged on the drive circuit layer, and the encapsulation structure layer arranged on the light emitting structure layer have been prepared on the base substrate. In a plane perpendicular to the display substrate, the drive circuit layer may include a transparent conductive layer, a first conductive layer, a first insulation layer, a semiconductor layer, a second insulation layer, a second conductive layer, a third insulation layer, a third conductive layer, and a planarization layer that are stacked in sequence on the base substrate. The light emitting structure layer may include a first electrode, a pixel define layer, an organic emitting layer, and a second electrode, and the encapsulation structure layer may include a first encapsulation layer, a second encapsulation layer, and a third encapsulation layer which are stacked.

In an exemplary implementation, the base substrate may be a flexible base substrate, or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. In an exemplary implementation, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (P1), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the semiconductor layer may be amorphous silicon (a-si).

In an exemplary implementation, a transparent conductive layer and an electrode conductive layer may be made of a transparent conductive material, such as Indium Tin Oxide (ITO) or Indium Zinc Oxide (IZO). The first conductive layer, the second conductive layer, and the third conductive layer may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer, the second insulation layer, and the third insulation layer may be made of any one or more of Silicon Oxide (SiOx), Silicon Nitride (SiNx), and Silicon Oxynitride (SiON), and may be a single-layer, a multiple layers, or a composite layer. The first insulation layer is referred to as a Buffer layer, the second insulation layer is referred to as a Gate Insulator (GI) layer, and the third insulation layer is referred to as an Interlayer Dielectric (ILD) layer. The planarization layer may be made of an organic material such as a resin, and the pixel define layer may be made of polyimide, acrylic, or polyethylene terephthalate.

At present, large-size display apparatuses, especially super-large-size display apparatuses, are usually spliced by multiple exposure processes using exposure machines, and display apparatuses spliced by multiple exposures have problems such as splicing mura. Generally, the splicing mura appears as an obvious dividing line in the side viewing angle. Through research, it is found that the splicing mura is caused by the alignment difference in the exposure process. Due to the deviation in the alignment from multiple exposures, in a display substrate formed by different exposure processes, a position of a light emitting area formed by the pixel opening is inconsistent with that of a signal line in the drive circuit layer (for example, a distance between an edge of the light emitting area and the signal line is inconsistent), resulting in different reflection degrees in different light emitting areas, thus causing different brightness of adjacent display substrates in the side viewing angle, and a splicing mura appears in the area near the splice line.

As can be seen from the structure and manufacturing process of the display substrate according to the present disclosure, in the display substrate according to the present disclosure, an orthographic projection of the first opening edge of the pixel opening on the base substrate and/or an orthographic projection of the second opening edge of the pixel opening on the base substrate is at least partially overlapped with an orthographic projection of a signal line on the base substrate, that is, the pixel opening is pressed on a metal line, so that not only a reflection degree of different pixel openings is basically the same, the emitted light of the pixel opening in the side viewing angle is largely light rays reflected by metal lines, which effectively reduces brightness differences of the side viewing angle due to alignment difference and effectively eliminates splicing mura.

In a display substrate according to an exemplary implementation of the present disclosure, by providing at least one notch on the first scan signal line and/or the second scan signal line, scan signal lines on two sides of the notch are interconnected through a signal connection electrode, which not only effectively reduces an amount of static electricity generated by a scan signal line in a dry etching process, but also avoids a case of breakdown of a channel of a transistor caused by static electricity accumulation, effectively avoids occurrence of edge dark spots in a display apparatus, and improves a yield and display quality on a premise of ensuring continuous transmission of a scan signal.

According to the display substrate of the exemplary implementation of the present disclosure, a transparent storage capacitor is adopted, the transparent storage capacitor consists of a transparent conductive layer and a transparent semiconductor layer, and since light may be emitted through the transparent storage capacitor, the storage capacitor may be arranged in a pixel opening, which effectively increases an amount of capacitance of the storage capacitor and increases an aperture ratio of a pixel. The manufacturing process according to the present disclosure may be implemented using an existing mature manufacturing equipment, and alterations to existing processes are small, such that the manufacturing process may be well compatible with an existing manufacturing process, be simple to implement, and be easy to practice, thereby achieving high production efficiency, low production cost and high yield.

A structure shown in the present disclosure and a manufacturing process thereof are merely exemplary description. In an exemplary implementation, a corresponding structure may be changed and patterning processes may be added or reduced according to actual needs, which is not limited here in the present disclosure.

In an exemplary implementation, the display substrate according to the present disclosure may be applied to a display apparatus having a pixel drive circuit, such as an OLED, quantum dot display (QLED), light emitting diode display (Micro LED or Mini LED), or Quantum Dot Light Emitting Diode display (QDLED), which is not limited here in the present disclosure.

The present disclosure further provides a display apparatus which includes the display substrate according to the aforementioned embodiments. The display apparatus may be any product or component with a display function, such as a mobile phone, a tablet computer, a television, a display, a laptop computer, a digital photo frame, and a navigator.

An exemplary implementation of the present disclosure further provides a method for driving the above-mentioned display substrate.

Figure 17:
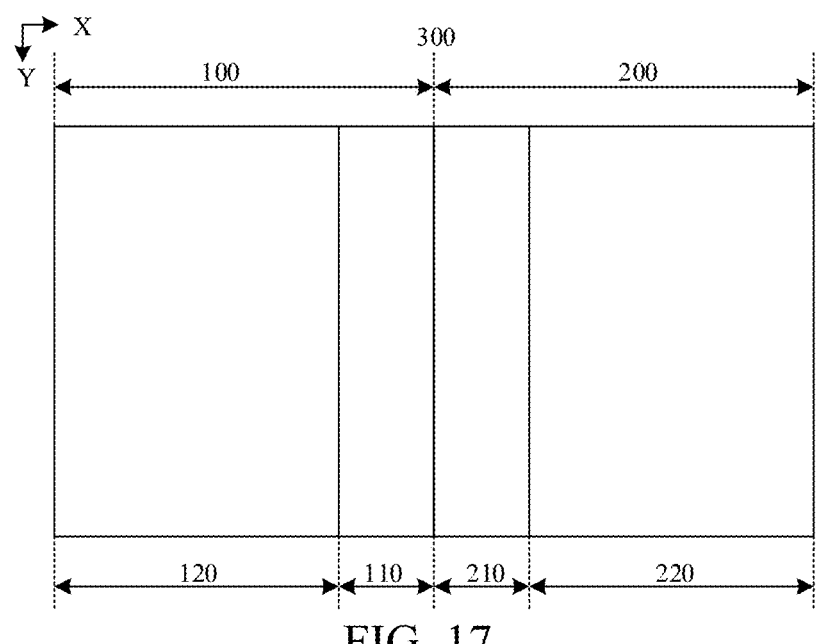
FIG. 17 is another schematic diagram of a structure of display substrate according to an exemplary embodiment of the present disclosure.

FIG. 17 is a schematic diagram of a structure of another display substrate according to an exemplary embodiment of the present disclosure. As shown in FIG. 17, the display substrate may at least include a first sub-base substrate 100 and a second sub-base substrate 200, and the first sub-base substrate 100 and the second sub-base substrate 200 may include a same structure layer, but each of structure layers in the first sub-base substrate 100 and the second sub-base substrate 200 adopts different exposure processes to splice the first sub-base substrate 100 and the second sub-base substrate 200 together, and a splice line 300 is formed at the junction where the first sub-base substrate 100 and the second sub-base substrate 200 are spliced.

In an exemplary implementation, each of the first sub-base substrate 100 and the second sub-base substrate 200 may include M pixel rows and N pixel columns, that is, each of the first sub-base substrate 100 and the second sub-base substrate 200 includes M*N sub-pixels arranged in a matrix, herein, both M and N are positive integers greater than 1.

In an exemplary implementation, each pixel column may include M sub-pixels sequentially arranged along the second direction Y, each sub-pixel may include a pixel drive circuit, and pixel drive circuits in the M sub-pixels in one pixel column are respectively connected to drive signal lines, and the drive signal lines are configured to provide drive signals to the M pixel drive circuits respectively.

In an exemplary implementation, a drive signal line may be a data signal line, a drive signal may be a data signal, and the data signal line is configured to provide data signals to M pixel drive circuits respectively.

In an exemplary implementation, a drive signal line may be a compensation signal line, a drive signal may be a compensation signal, and the compensation signal line is configured to provide the compensation signal to the M pixel drive circuits respectively.

In an exemplary implementation, the first sub-base substrate 100 may at least include a first transition region 110 close to the splice line 300 and a first normal region 120 located at a side of the first transition region 110 away from the splice line 300, and the second sub-base substrate 200 may at least include a second transition region 210 close to the splice line 300 and a second normal region 220 located at a side of the second transition region 210 away from the splice line 300, that is, the first transition region 110 and the second transition region 210 are located on two sides of the splice line 300 respectively, and are adjacent to the splice line 300.

In an exemplary implementation, the first transition region 110 and the second transition region 210 may each include n pixel columns, that is, the first transition region 110 and the second transition region 210 may each include n*M sub-pixels, wherein n is a positive integer greater than 1 and less than N.

In an exemplary implementation, n may be about 20 to 200, i.e., the first transition region 110 and the second transition region 210 may each include 20 to 200 pixel columns.

In an exemplary implementation, in a front viewing angle, brightness of the first sub-base substrate 100 is substantially the same as brightness of the second sub-base substrate 200, that is, the brightness of the first transition region 110 is substantially the same as the brightness of the second transition region 210. Under a side viewing angle, due to the brightness difference caused by the alignment difference, the brightness of the first sub-base substrate 100 is higher than the brightness of the second sub-base substrate 200, that is, the brightness of the first transition region 110 is higher than the brightness of the second transition region 210, and a splicing mura appears in an area near the splice line 300.

In order to solve problems such as splicing mura in existing display apparatuses, the present disclosure provides a method for driving a display substrate. In an exemplary implementation, the display substrate at least includes a first sub-base substrate and a second sub-base substrate that are spliced together, wherein a splice line is formed at a junction where the first sub-base substrate and the second sub-base substrate are spliced. The first sub-base substrate at least includes a first transition region close to the splice line and a first normal region located at a side of the first transition region away from the splice line, and the second sub-base substrate at least includes a second transition region close to the splice line and a second normal region located at a side of the second transition region away from the splice line. The first transition region and the second transition region each include at least one pixel column. Each pixel column includes M sub-pixels, a sub-pixel at least includes a pixel drive circuit, the pixel drive circuit is connected to a drive signal line, and M is a positive integer greater than 1. The method for driving the display substrate may include:

processing at least one original drive signal of at least one pixel column in the first transition region and the second transition region into at least one processed drive signal; and supplying the at least one processed drive signal and remaining original drive signals to M pixel drive circuits in the pixel column through the drive signal line of the pixel column.

In an exemplary implementation, in at least one of the first transition region and the second transition region, a quantity of original drive signals in the pixel column gradually decreases and a quantity of processed drive signals in the pixel column gradually increases along a direction close to the splice line.

In an exemplary implementation, in at least one of the first transition region and the second transition region, a quantity of original drive signals in a pixel column farthest from the splice line is M.

In an exemplary implementation, in at least one of the first transition region and the second transition region, a quantity of processed drive signals in the pixel column closest to the splice line is k*M, and a quantity of original drive signals is (1−k)*M, wherein k=0.2 to 0.8.

In an exemplary implementation, k=0.5.

In an exemplary implementation, the drive signal may include a data signal line, the drive signal line may include a data signal, and the processed drive signal lines may include a first data signal and/or a second data signal;

In an exemplary implementation, the first data signal is V−ΔV, the second data signal is V+ΔV, wherein V is an original data signal, and ΔV is an additional signal for changing the original data signal.

In an exemplary implementation, a numerical value of the additional signal ΔV may be determined according to an amount of change in the display gray scale. For example, the display gray scale corresponding to the original data signal is 100, and a numerical value of the additional signal ΔV may be determined by setting the display gray scale corresponding to the first data signal or the second data signal to 99 or 101.

In an exemplary implementation, the drive signal may include a compensation signal line, the drive signal line may include a compensation signal, and the processed drive signals may include a first compensation signal and/or a second compensation signal.

In an exemplary implementation, for the first transition region, the original compensation signal may be a compensation signal of an i-th pixel column in the first transition region, and the first compensation signal may be a compensation signal of a j-th pixel column in the second transition region.

In an exemplary implementation, for the second transition region, the original compensation signal may be a compensation signal of the j-th pixel column in the second transition region, and the second compensation signal may be a compensation signal of the i-th pixel column in the first transition region.

A method for driving the display substrate according to the present disclosure will be illustrated with examples below through some exemplary implementations. In the following embodiments, each of the first transition region 110 and the second transition region 210 includes n pixel columns, a serial number of the pixel columns gradually increases along the direction away from the splice line 300, and the n-th pixel column is located at a side of the first pixel column away from the splice line 300. Each pixel column includes M sub-pixels, that is, the quantity of pixel rows in each of the first transition region 110 and the second transition region 210 is M.

Figures 18, 19:
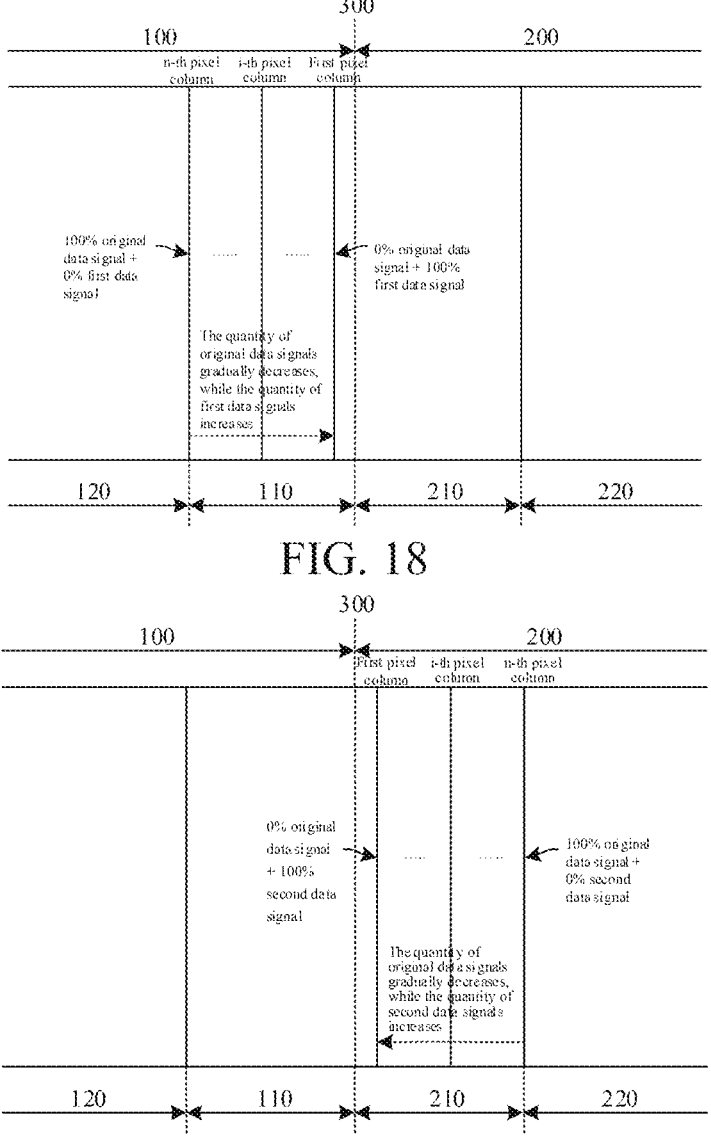
FIG. 18 is a diagram of a method for driving a display substrate according to an exemplary embodiment of the present disclosure.
FIG. 19 is another diagram of a method for driving a display substrate according to an exemplary embodiment of the present disclosure.

FIG. 18 is a diagram of a method for driving a display substrate according to an exemplary embodiment of the present disclosure. In an exemplary implementation, the method for driving the display substrate according to the present embodiment may include:

A1. Data signals of n pixel columns in the first transition region 110 are processed, such that data signals of each pixel column include an original signal group and a processed signal group. An original signal group of an i-th pixel column includes M1 original data signals, and a processed signal group of the i-th pixel column includes M2 first data signals, wherein M1=M [(i−1)/(n−1)], M2=M[1−(i−1)/(n−1)], and i=1, 2, . . . , n.

A2. In each pixel column of the first normal region 120, the second transition region 210, and the second normal region 220, M original data signals are respectively supplied to M pixel drive circuits in the pixel column through data signal lines. In each pixel column of the first transition region 110, M1 original data signals in the original signal group and M2 first data signals in the processed signal group are respectively supplied to M pixel drive circuits in the pixel column through data signal lines.

An exemplary embodiment of the present disclosure provides a driving method that gradually reduces brightness of a first transition region, so as to alleviate the brightness difference between two display substrates in a side viewing angle, which effectively avoid splicing mura.

As shown in FIG. 18, in an exemplary embodiment, for the first normal region 120, the second transition region 210, and the second normal region 220, data signal lines in all pixel columns provide original data signals to achieve display of each pixel column at a normal brightness. For the first transition region 110, the data signal lines in all pixel columns provide part of original data signals and part of first data signals, wherein the first data signals are data signals obtained by processing the original data signals, to achieve display of each pixel column with brightness reduction. In the front viewing angle, although brightness difference between the first transition region 110 and the second transition region 210 increases, an obvious dividing line is not formed. In the side viewing angle, brightness difference between the first transition region 110 and the second transition region 210 is reduced, and no obvious dividing line is formed. In this way, by dispersing the brightness difference to two directions of the front viewing angle and the side viewing angle, the brightness difference between the first transition region 110 and the second transition region 210 in the side viewing angle is effectively reduced, so that the splicing muras in the two directions of the front viewing angle and the side viewing angle are not visible.

In the exemplary embodiment, along the direction close to the splice line 300, a quantity of original data signals supplied by the data signal lines in each pixel column gradually decreases, and a quantity of first data signals supplied by the data signal lines in each pixel column gradually increases. The brightness of each pixel column in the first transition region 110 gradually decreases, such that a first brightness transition region in which the brightness gradually transitions is formed in the first transition region 110, which has relatively little influence on the display effect in both directions of the front viewing angle and the side viewing angle.

In the exemplary embodiment, since data signal lines of a pixel column farthest from the splice line 300 (the n-th pixel column) in the first transition region 110 provide all the original data signals, the brightness of the pixel column does not change. Data signal lines of all the pixel columns in the first normal region 120 provide all the original data signals, and brightness of the first normal region 120 does not change. Therefore, a dividing line is not formed at a junction between the first transition region 110 and the first normal region 120 in either direction of the front viewing angle or the side viewing angle.

In the exemplary implementation, since all data signal lines of a pixel column closest to the splice line 300 (the first pixel column) in the first transition region 110 provide the first data signal, i.e., the brightness of the pixel column decreases the most, and all the data signal lines of all the pixel columns in the second transition region 210 provide the original data signal, i.e., the brightness of the second transition region 210 does not change, the brightness at the junction between the first transition region 110 and the second transition region 210 is gradually transitioned in the two directions of the front viewing angle and the side viewing angle. The brightness difference increases in the front viewing angle and decreases in the side viewing angle, which disperses the brightness difference in both directions of the front viewing angle and the side viewing angle and reduces the brightness difference between the first transition region 110 and the second transition region 210 in the side viewing angle, thereby ensuring that no obvious dividing line is formed between the first transition region 110 and the second transition region 210 under either the front or side viewing angle, making the splicing mura invisible under both the front viewing angle and the side viewing angle.

In an exemplary implementation, the first pixel column providing 100% first data signal and the n-th pixel column providing 100% original data signal in the present embodiment are merely examples, and the first pixel column and the n-th pixel column may include a part of original data signals and a part of first data signals. For example, the first pixel column may include 1% original data signal and 99% first data signal, and the n-th pixel column may include 99% original data signal and 1% first data signal, and the present disclosure is not limited herein.

FIG. 19 is another diagram of a method for driving a display substrate according to an exemplary embodiment of the present disclosure. In an exemplary implementation, the method for driving the display substrate according to the present embodiment may include:

B1. Data signals of n pixel columns in the second transition region 210 are processed, such that the data signals of each pixel column include an original signal group and a processed signal group. The original signal group of the j-th pixel column includes M3 original data signals, and the processed signal group of the j-th pixel column includes M4 second data signals, wherein $M3 = M[(j-1)/(n-1)]$, $M4 = M[1-(j-1)/(n-1)]$, and $j=1$, 2, . . . , n.

B2. In each pixel column of the first transition region 110, the first normal region 120, and the second normal region 220, M original data signals are respectively supplied to M pixel drive circuits in the pixel column through data signal lines. In each pixel column of the second transition region 210, M3 original data signals in the original signal group and M4 second data signals in the processed signal group are respectively supplied to the M pixel drive circuits in the pixel column through data signal lines.

An exemplary embodiment of the present disclosure provides a driving method that gradually increases brightness of a second transition region, so as to alleviate the brightness difference between two display substrates in a side viewing angle, which effectively avoid splicing mura.

As shown in FIG. 19, in an exemplary embodiment, for the first transition region 110, the first normal region 120, and the second normal region 220, the data signal lines in all pixel columns provide original data signals to achieve display of each pixel column at a normal brightness. For the second transition region 210, the data signal lines in all pixel columns provide part of original data signals and part of second data signals, wherein the second data signals are data signals obtained by processing the original data signals, to achieve display of each pixel column with brightness increase. In the front viewing angle, although the brightness difference between the first transition region 110 and the second transition region 210 increases, an obvious dividing line is not formed. In the side viewing angle, the brightness difference between the first transition region 110 and the second transition region 210 is reduced, and no obvious dividing line is formed. In this way, by dispersing the brightness difference to the two directions of the front viewing angle and the side viewing angle, the brightness difference between the first transition region 110 and the second transition region 210 in the side viewing angle is effectively reduced, so that the splicing muras in the two directions of the front viewing angle and the side viewing angle are not visible.

In the exemplary embodiment, along the direction close to the splice line 300, a quantity of original data signals supplied by the data signal lines in each pixel column gradually decreases, a the quantity of second data signals supplied by the data signal lines in each pixel column gradually increases. The brightness of each pixel column in the second transition region 210 gradually increases, such that a second brightness transition region in which the brightness gradually transitions is formed in the second transition region 210, which has relatively little influence on the display effect in both directions of the front viewing angle and the side viewing angle.

In the exemplary embodiment, since data signal lines of a pixel column farthest from the splice line 300 (the n-th pixel column) in the second transition region 210 provide all the original data signals, brightness of the pixel column does not change. Data signal lines of all of the pixel columns in the second normal region 220 provide all the original data signals, and brightness of the second normal region 220 does not change. Therefore, a dividing line is not formed at a junction between the second transition region 210 and the second normal region 220 in either direction of the front viewing angle or the side viewing angle.

In the exemplary implementation, since all the data signal lines of a pixel column closest to the splice line 300 (the first pixel column) in the second transition region 210 provide the second data signal, i.e., the brightness of the pixel column increases the most, and all the data signal lines of all the pixel columns in the first transition region 110 provide the original data signal, i.e., the brightness of the first transition region 110 does not change, the brightness at the junction between the first transition region 110 and the second transition region 210 is gradually transitioned in the two directions of the front viewing angle and the side viewing angle. The brightness difference increases in the front viewing angle and decreases in the side viewing angle, which disperses the brightness difference in both directions of the front viewing angle and the side viewing angle and reduces the brightness difference between the first transition region 110 and the second transition region 210 in the side viewing angle, thereby ensuring that no obvious dividing line is formed between the first transition region 110 and the second transition region 210 under either the front or side viewing angle, making the splicing mura invisible in both the front viewing angle and the side viewing angle.

In an exemplary implementation, the first pixel column providing 100% second data signal and the n-th pixel column providing 100% original data signal in the present embodiment are merely examples, and the first pixel column and the n-th pixel column may include a part of original data signals and a part of second data signals. For example, the first pixel column may include 1% original data signal and 99% second data signal, and the n-th pixel column may include 99% original data signal and 1% second data signal, and the present disclosure is not limited herein.

Figure 20:
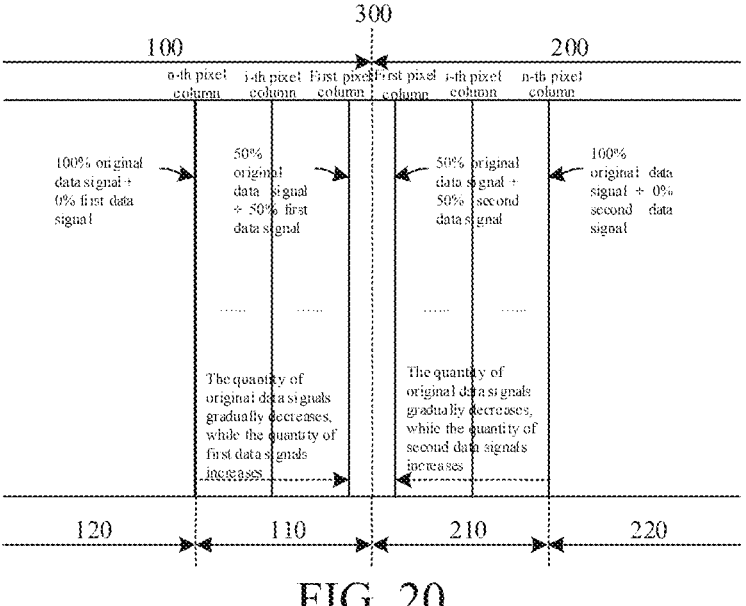
FIG. 20 is another diagram of a method for driving a display substrate according to an exemplary embodiment of the present disclosure.

FIG. 20 is another diagram of a method for driving a display substrate according to an exemplary embodiment of the present disclosure. In an exemplary implementation, the method for driving the display substrate according to the present embodiment may include:

C1. Data signals of n pixel columns in the first transition region 110 and the second transition region 210 are processed, respectively, such that data signals of each pixel column include an original signal group and a processed signal group. In the first transition region 110, an original signal group of an i-th pixel column includes M1 original data signals, and a processed signal group of the i-th pixel column includes M2 first data signals, wherein M1=0.5*M[(i−1)/(n−1)], and M2=0.5*M[1−(i−1)/(n−1)]. In the second transition region 210, an original signal group of a j-th pixel column includes M3 original data signals, and a processed signal group of the j-th pixel column includes M4 second data signals, M3=0.5*M[(j−1)/(n−1)] and M4=0.5*M[1−(j−1)/(n−1)], wherein i=1, 2, . . . , n, and j=1, 2, . . . , n.

C2. In each pixel column of the first normal region 120 and the second normal region 220, M original data signals are respectively supplied to M pixel drive circuits in the pixel column through data signal lines.

C3. In each pixel column of the first transition region 110, M1 original data signals in the original signal group and M2 first data signals in the processed signal group are respectively supplied to M pixel drive circuits in the pixel column through data signal lines. In each pixel column of the second transition region 210, M3 original data signals in the original signal group and M4 second data signals in the processed signal group are respectively supplied to M pixel drive circuits in the pixel column through data signal lines.

The present disclosure provides a driving method that gradually reduces brightness of a first transition region and gradually increasing brightness of a second transition region, so as to alleviate the brightness difference between two display substrates in a side viewing angle, which effectively avoid splicing mura.

As shown in FIG. 20, in an exemplary embodiment, for the first normal region 120 and the second normal region 220, data signal lines in all pixel columns provide original data signals to achieve display of each pixel column at a normal brightness. For the first transition region 110, data signal lines in all pixel columns provide a part of original data signals and a part of first data signals, to achieve display of each pixel column with brightness reduction. For the second transition region 210, the data signal lines in all pixel columns provide a part of original data signals and a part of second data signals to achieve display of each pixel column with brightness increase. In the front viewing angle, although the brightness difference between the first transition region 110 and the second transition region 210 increases, an obvious dividing line is not formed. In the side viewing angle, the brightness difference between the first transition region 110 and the second transition region 210 is reduced, and no obvious dividing line is formed. In this way, by dispersing the brightness difference to the two directions of the front viewing angle and the side viewing angle, the brightness difference between the first transition region 110 and the second transition region 210 in the side viewing angle is effectively reduced, so that the splicing muras in the two directions of the front viewing angle and the side viewing angle are not visible.

In the exemplary embodiment, along the direction close to the splice line 300, a quantity of original data signals supplied by the data signal lines in each pixel column gradually decreases, and a quantity of first data signals or second data signals supplied by the data signal lines in each pixel column gradually increases. The brightness of each pixel column in the first transition region 110 gradually decreases, and the brightness of each pixel column in the second transition region 210 gradually increases, such that a first brightness transition region and a second brightness transition region in which the brightness gradually transitions are respectively formed in the first transition region 110 and the second transition region 210, which has relatively little influence on the display effect in both directions of the front viewing angle and the side viewing angle.

In an exemplary implementation, since data signal lines of a pixel column farthest from the splice line 300 in the first transition region 110 and the second transition region 210 all provide original data signals, the brightness of the pixel columns does not change. Data signal lines of all the pixel columns in the first normal region 120 and the second normal region 220 all provide original data signals, and brightness of the first normal region 120 and the second normal region 220 does not change. Therefore, a dividing line is not formed at the junction between the first transition region 110 and the first normal region 120 or at the junction between the second transition region 210 and the second normal region 220 in either direction of the front viewing angle or the side viewing angle.

In the exemplary embodiment, since data signal line of a pixel column closest to the splice line 300 in the first transition region 110 provides 50% original data signal and 50% first data signal, and the data signal line of the pixel column closest to the splice line 300 in the second transition region 210 provides 50% original data signal and 50% second data signal, the brightness at the junction between the first transition region 110 and the second transition region 210 is gradually transitioned in the two directions of the front viewing angle and the side viewing angle. The brightness difference increases in the front viewing angle and decreases in the side viewing angle, which disperses the brightness difference in both directions of the front viewing angle and the side viewing angle and reduces the brightness difference between the first transition region 110 and the second transition region 210 in the side viewing angle, thereby ensuring that no obvious dividing line is formed between the first transition region 110 and the second transition region 210 under either the front or side viewing angle, making the splicing mura invisible under both the front viewing angle and the side viewing angle.

In an exemplary implementation, the first pixel column of the first transition region 110 providing 50% original data signal and 50% first data signal, and the first pixel column of the second transition region 210 providing 50% original data signal and 50% second data signal in the present embodiment are merely examples, and the present disclosure is not limited herein. For example, the first pixel column of the first transition region 110 may provide k*M first data signals and (1−k)*M original data signals, and the first pixel column of the second transition region 210 may provide k*M second data signals and (1−k)*M original data signals, wherein k=0.2 to 0.8.

Figure 21:
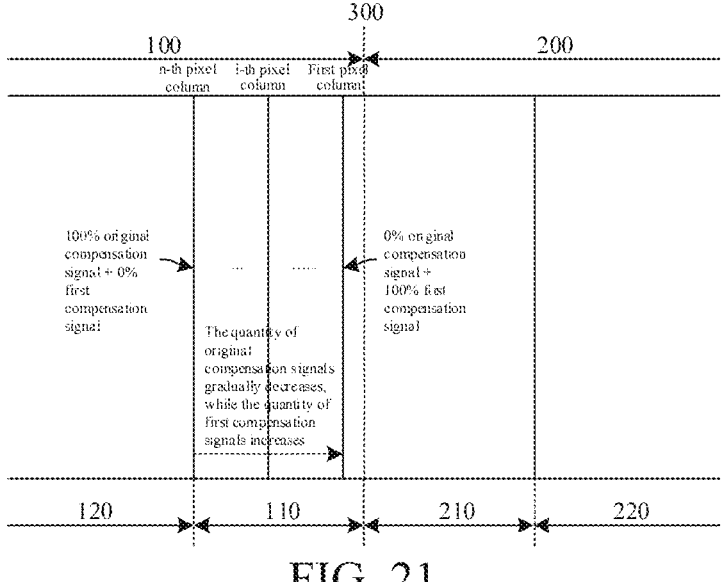
FIG. 21 is another diagram of a method for driving a display substrate according to an exemplary embodiment of the present disclosure.

FIG. 21 is another diagram of a method for driving a display substrate according to an exemplary embodiment of the present disclosure. In an exemplary implementation, the method for driving the display substrate according to the present embodiment may include:

D1. Compensation signals of n pixel columns in the second transition region 210 are extracted, and compensation signals of n pixel columns in the first transition region 110 are processed, so that the compensation signals of each pixel column in the first transition region 110 include an original signal group and a processed signal group. An original signal group of an i-th pixel column includes M1 original compensation signals, and a processed signal group of an i-th pixel column includes M2 first compensation signals, wherein M1=M[(i−1)/(n−1)], M2=M[1−(i−1)/(n−1)]. An original compensation signal of the i-th pixel column may be the compensation signal of the i-th pixel column in the first transition region 110, and a first compensation signal of the i-th pixel column may be the compensation signal of the j-th pixel column in the second transition region 210, wherein i=1, 2, . . . , n, and j=1, 2, . . . , n.

D2. In each pixel column of the first normal region 120, the second transition region 210, and the second normal region 220, M original compensation signals are respectively supplied to M pixel drive circuits in the pixel column through compensation signal lines. In each pixel column of the first transition region 110, M1 original compensation signals in the original signal group and M2 first compensation signals in the processed signal group are respectively supplied to M pixel drive circuits in the pixel column through compensation signal lines.

An exemplary embodiment of the present disclosure provides a driving method that gradually changes brightness of a first transition region, so as to alleviate the brightness difference between two display substrates in a side viewing angle, which effectively avoid splicing mura.

As shown in FIG. 21, in an exemplary implementation, for the first normal region 120, the second transition region 210, and the second normal region 220, compensation signal lines in all pixel columns provide original compensation signals to achieve display of each pixel column at normal brightness. For the first transition region 110, the compensation signal lines in all pixel columns provide a part of original compensation signals and a part of first compensation signals, wherein a first compensation signal is a compensation signal of a corresponding pixel column in the second transition region 210, to achieve display of each pixel column with brightness change. The brightness difference between the first transition region 110 and the second transition region 210 in the side viewing angle is effectively reduced, making the splicing mura invisible in the side viewing angle.

In the exemplary embodiment of the present disclosure, the compensation signal of the corresponding pixel column in the second transition region 210 is partially or completely adopted in each pixel column in the first transition region 110, and the brightness of each pixel column in the first transition region 110 is adjusted by changing the compensation signal, so that the brightness of each pixel column in the first transition region 110 gradually approaches the brightness of the corresponding pixel column in the second transition region 210 in the side viewing angle.

In the exemplary embodiment, along the direction close to the splice line 300, a quantity of original compensation signals supplied by compensation signal lines in each pixel column gradually decreases, and a quantity of first compensation signals supplied by compensation signal lines in each pixel column gradually increases. The change in brightness of each pixel column in the first transition region 110 gradually increases, such that a first brightness transition region in which the brightness gradually transitions is formed in the first transition region 110, which has relatively little influence on the display effect in both directions of the front viewing angle and the side viewing angle.

In the exemplary embodiment, since compensation signal lines of a pixel column farthest from the splice line 300 (the n-th pixel column) in the first transition region 110 provide all the original compensation signals, the brightness of the pixel column does not change. The compensation signal lines of all the pixel columns in the first normal region 120 provide all the original compensation signals, and the brightness of the first normal region 120 does not change. Therefore, a dividing line is not formed at the junction between the first transition region 110 and the first normal region 120 in either direction of the front viewing angle or the side viewing angle.

In an exemplary implementation, since compensation signal lines of a pixel columns (a first pixel column) closest to the splice line 300 in the first transition region 110 and the second transition region 210 are all first compensation signals (compensation signal of a first pixel column in the second transition region 210), and the compensation signals of the two pixel columns are the same, a brightness compensation degree of the pixel columns at the junction between the first transition region 110 and the second transition region 210 is the same. Therefore, the brightness difference between the first transition region 110 and the second transition region 210 is effectively reduced, which ensures that an obvious dividing line is not formed between the first transition region 110 and the second transition region 210 in the side viewing angle, making the splicing mura invisible in the side viewing angle.

In an exemplary implementation, the first pixel column providing 100% first compensation signal and the n-th pixel column providing 100% original compensation signal in the present embodiment are merely examples, and the first pixel column and the n-th pixel column may include a part of original compensation signal and a part of first compensation signal. For example, the first pixel column may include 1% original compensation signal and 99% first compensation signal, and the n-th pixel column may include 99% original compensation signal and 1% first compensation signal, and the present disclosure is not limited herein.

Figures 22, 23:
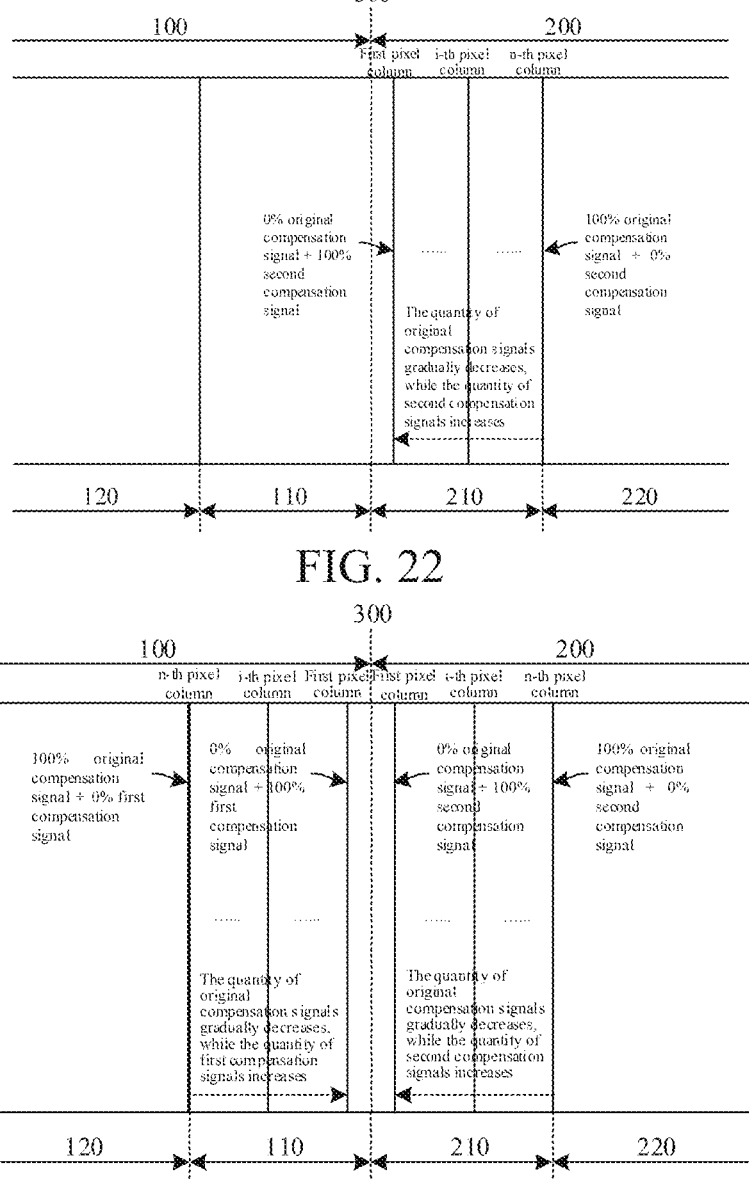
FIG. 22 is another diagram of a method for driving a display substrate according to an exemplary embodiment of the present disclosure.
FIG. 23 is another diagram of a method for driving a display substrate according to an exemplary embodiment of the present disclosure.

FIG. 22 is another diagram of a method for driving a display substrate according to an exemplary embodiment of the present disclosure. In an exemplary implementation, the method for driving the display substrate according to the present embodiment may include:

E1. Compensation signals of n pixel columns in the first transition region 110 are extracted, and compensation signals of n pixel columns in the second transition region 210 are processed, so that compensation signals of each pixel column in the second transition region 210 include an original signal group and a processed signal group. An original signal group of a j-th pixel column includes M3 original compensation signals, and a processed signal group of the j-th pixel column includes M4 second compensation signals, wherein M3=M[(j−1)/(n−1)], M4=M[1−(j−1)/(n−1)]. An original compensation signal of the j-th pixel column may be the compensation signal of the j-th pixel column in the second transition region 210, and the second compensation signal of the j-th pixel column may be the compensation signal of the i-th pixel column in the first transition region 110, wherein i=1, 2, . . . , n, and j=1, 2, . . . , n.

E2. In each pixel column of the first transition region 110, the first normal region 120, and the second normal region 220, M original compensation signals are respectively supplied to M pixel drive circuits in the pixel column through compensation signal lines. In each pixel column of the second transition region 210, M3 original compensation signals in the original signal group and M4 second compensation signals in the processed signal group are respectively supplied to M pixel drive circuits in the pixel column through compensation signal lines.

An exemplary embodiment of the present disclosure provides a driving method that gradually changes brightness of a second transition region, so as to alleviate the brightness difference between two display substrates in a side viewing angle, which effectively avoid splicing mura.

As shown in FIG. 22, in the exemplary embodiment, for the first transition region 110, the first normal region 120, and the second normal region 220, compensation signal lines in all pixel columns provide original compensation signals to achieve display of each pixel column at normal brightness. For the second transition region 210, compensation signal lines in all pixel columns provide a part of original compensation signals and a part of second compensation signals, wherein a second compensation signal is a compensation signal of a corresponding pixel column in the first transition region 110, to achieve brightness change display of each pixel column. The brightness difference between the first transition region 110 and the second transition region 210 in the side viewing angle is effectively reduced, making the splicing mura invisible in the side viewing angle.

In the exemplary embodiment of the present disclosure, the compensation signal of the corresponding pixel column in the first transition region 110 is partially or completely adopted in each pixel column in the second transition region 210, and the brightness of each pixel column in the second transition region 210 is adjusted by changing the compensation signal, so that the brightness of each pixel column in the second transition region 210 gradually approaches the brightness of the corresponding pixel column in the first transition region 110 in the side viewing angle.

In the exemplary embodiment, along the direction close to the splice line 300, a quantity of original compensation signals supplied by compensation signal lines in each pixel column gradually decreases, and a quantity of second compensation signals supplied by the compensation signal lines in each pixel column gradually increases. The change in brightness of each pixel column in the second transition region 210 gradually increases, such that a second brightness transition region in which the brightness gradually transitions is formed in the second transition region 210, which has relatively little influence on the display effect in both directions of the front viewing angle and the side viewing angle.

In the exemplary embodiment, since compensation signal lines of a pixel column farthest from the splice line 300 (the n-th pixel column) in the second transition region 210 provide all the original compensation signals, the brightness of the pixel column does not change. The compensation signal lines of all the pixel columns in the second normal region 220 provide all the original compensation signals, and the brightness of the second normal region 220 does not change. Therefore, a dividing line is not formed at the junction between the second transition region 210 and the second normal region 220 in either direction of the front viewing angle or the side viewing angle.

In an exemplary implementation, since compensation signal lines of pixel columns (first pixel columns) closest to the splice line 300 in the first transition region 110 and the second transition region 210 are all the second compensation signals (the compensation signal of the first pixel column in the first transition region 110), and the compensation signals of the two pixel columns are the same, the brightness compensation degree of the pixel columns at the junction between the first transition region 110 and the second transition region 210 is the same. Therefore, the brightness difference between the first transition region 110 and the second transition region 210 is effectively reduced, which ensures that an obvious dividing line is not formed between the first transition region 110 and the second transition region 210 in the side viewing angle, making the splicing mura invisible in the side viewing angle.

In an exemplary implementation, the first pixel column providing 100% second compensation signal and the n-th pixel column providing 100% original compensation signal in the present embodiment are merely examples, and the first pixel column and the n-th pixel column may include a part of original compensation signal and a part of second compensation signal. For example, the first pixel column may include 1% original compensation signal and 99% second compensation signal, and the n-th pixel column may include 99% original compensation signal and 1% second compensation signal, and the present disclosure is not limited herein.

FIG. 23 is another diagram of a method for driving a display substrate according to an exemplary embodiment of the present disclosure. In an exemplary implementation, the method for driving the display substrate according to the present embodiment may include:

F1. Compensation signals of n pixel columns in the first transition region 110 and the second transition region 210 are extracted respectively, and compensation signals of n pixel columns in the first transition region 110 and the second transition region 210 are processed, so that compensation signals of each pixel column in the first transition region 110 and the second transition region 210 include an original signal group and a processed signal group. In the first transition region 110, an original signal group of an i-th pixel column includes M1 original compensation signals, and a processed signal group of the i-th pixel column includes M2 first compensation signals, wherein $M1=M[(i-1)/(n-1)]$, $M2=M[1-(i-1)/(n-1)]$. An original compensation signal of the i-th pixel column may be a compensation signal of the i-th pixel column in the first transition region 110, and a first compensation signal of the i-th pixel column may be a compensation signal of the j-th pixel column in the second transition region 210. In the second transition region 210, an original signal group of a j-th pixel column includes M3 original compensation signals, and a processed signal group of the j-th pixel column includes M4 second compensation signals, wherein $M3=M[(j-1)/(n-1)]$, $M4=M[1-(j-1)/(n-1)]$. An original compensation signal of the j-th pixel column may be a compensation signal of the j-th pixel column in the second transition region 210, and a second compensation signal of the j-th pixel column may be the compensation signal of the i-th pixel column in the first transition region 110, wherein $i=1, 2, \ldots, n$, and $j=1, 2, \ldots, n$.

F2. In each pixel column of the first normal region 120, and the second normal region 220, M original compensation signals are respectively supplied to M pixel drive circuits in the pixel column through compensation signal lines. In each pixel column of the first transition region 110, M1 original compensation signals in the original signal group and M2 first compensation signals in the processed signal group are respectively supplied to M pixel drive circuits in the pixel column through compensation signal lines. In each pixel column of the second transition region 210, M3 original compensation signals in the original signal group and M4 second compensation signals in the processed signal group are respectively supplied to the M pixel drive circuits in the pixel column through compensation signal lines.

An exemplary embodiment of the present disclosure provides a driving method that gradually changes brightness of a first transition region and a second transition region, so as to alleviate the brightness difference between two display substrates in a side viewing angle, which effectively avoid splicing mura.

As shown in FIG. 23, in the exemplary embodiment, for the first normal region 120 and the second normal region 220, compensation signal lines in all pixel columns provide original compensation signals to achieve display of each pixel column at normal brightness. For the first transition region 110, the compensation signal lines in all pixel columns provide a part of original compensation signals and a part of first compensation signals, and for the second transition region 210, the compensation signal lines in all pixel columns provide a part of original compensation signals and a part of second compensation signals. A first compensation signal may be a compensation signal of a corresponding pixel column in the second transition region 210, and a second compensation signal may be a compensation signal of a corresponding pixel column in the first transition region 110, to achieve brightness change display of each pixel column. The brightness difference between the first transition region 110 and the second transition region 210 in the side viewing angle is effectively reduced, making the splicing mura invisible in the side viewing angle.

In an exemplary embodiment of the present disclosure, the compensation signal of the corresponding pixel column in the second transition region 210 is partially or completely adopted in each pixel column of the first transition region 110, the compensation signal of the corresponding pixel column in the first transition region 110 is partially or completely adopted in each pixel column of the second transition region 210, and the brightness of each pixel column in the first transition region 110 and the second transition region 210 is adjusted by changing the compensation signal, so that the brightness of each pixel column in the first transition region 110 gradually approaches the brightness of each pixel column in the second transition region 210 in the side viewing angle.

In the exemplary embodiment, along the direction close to the splice line 300, a quantity of original compensation signals supplied by the compensation signal lines in each pixel column gradually decreases, and a quantity of first compensation signals or second compensation signals supplied by the compensation signal lines in each pixel column gradually increases. The change in brightness of each pixel column in the first transition region 110 and the second transition region 210 gradually increases, such that a first brightness transition region and a second brightness transition region in which the brightness gradually transitions are respectively formed in the first transition region 110 and the second transition region 210, which has relatively little influence on the display effect in both directions of the front viewing angle and the side viewing angle.

In the exemplary embodiment, since compensation signal lines of a pixel column farthest from the splice line 300 in the first transition region 110 and the second transition region 210 provide all the original compensation signals, the brightnesses of the pixel columns do not change. Compensation signal lines of all the pixel columns in the first normal region 120 and the second normal region 220 provide all the original compensation signals, and brightnesses of the first normal region 120 and the second normal region 220 do not change. Therefore, a dividing line is not formed at the junction between the first transition region 110 and the first normal region 120 or at the junction between the second transition region 210 and the second normal region 220 in either direction of the front viewing angle or the side viewing angle.

In an exemplary implementation, since the compensation signal lines of a pixel column closest to the splice line 300 in the first transition region 110 and the second transition region 210 are all first compensation signals (a compensation signal of the first pixel column in the second transition region 210) and second compensation signals (a compensation signal of the first pixel column in the first transition region 110), the compensation signals of the two pixel columns are exchanged, and a brightness compensation degree of the pixel columns at the junction between the first transition region 110 and the second transition region 210 are exchanged. Therefore, the brightness difference between the first transition region 110 and the second transition region 210 is effectively reduced, which ensures that an obvious dividing line is not formed between the first transition region 110 and the second transition region 210 in the side viewing angle, making the splicing mura invisible in the side viewing angle.

In an exemplary implementation, a first compensation signal of the first transition region 110 and a second compensation signal of the second transition region 210 may be interchanged in the same row, or may be interchanged in the same column, or may be randomly assigned, and the present disclosure is not limited herein.

In an exemplary implementation, the first pixel column of the first transition region 110 providing 100% first compensation signal and the first pixel column of the second transition region 210 providing 100% of the second compensation signal in the present embodiment are merely examples, and the present disclosure is not limited herein. For example, the first pixel column of the first transition region 110 may include 1% original data signal and 99% first compensation signal, the n-th pixel column of the first transition region 110 may include 99% original data signal and 1% first compensation signal, the first pixel column of the second transition region 210 may include 1% original data signal and 99% second compensation signal, and the n-th pixel column of the second transition region 210 may include 99% original data signal and 1% second compensation signal.

In an exemplary implementation, calculation expressions of M1, M2, M3, and M4 in the foregoing embodiments are merely illustrative examples, and other expressions capable of incrementing the processed signal may be adopted, and the calculation values of the calculation expressions may be rounded to integers, and the present disclosure is not limited here.

The present disclosure provides a method for driving a display substrate, wherein by changing the brightness of a first transition region and/or a second transition region, and gradually transitioning brightness of each pixel column along a direction close to a splice line, the brightness difference between the first transition region and the second transition region in a side viewing angle is effectively reduced. The brightness difference between two display substrates in a side viewing angle caused by an alignment difference is effectively alleviated, and a splicing mura is effectively avoided.

An exemplary implementation of the present disclosure further provides a driving device including a processor and a memory in which a computer program runnable on the processor is stored, wherein the processor performs steps of the aforementioned method for driving a display substrate.

An exemplary implementation of the present disclosure further provides a non-transitory computer-readable storage medium storing program instructions, wherein when the program instructions are executed, the aforementioned method for driving the display substrate is performed.

Although the implementations of the present disclosure are disclosed above, the contents are only implementations used for ease of understanding of the present disclosure, but not intended to limit the present disclosure. Any of those skilled in the art to which the present disclosure pertains may make any modification and variation in a form and details of implementation without departing from the spirit and scope of the present disclosure. However, the patent protection scope of the present invention should be subject to the scope defined in the appended claims.

The invention claimed is:

1. A display substrate comprising a plurality of sub-pixels, wherein at least one sub-pixel comprises a pixel drive circuit and a light emitting device at least comprising a first electrode and a pixel define layer, the first electrode is connected to the pixel drive circuit, and the pixel define layer is provided with a pixel opening exposing the first electrode; the pixel opening at least comprises a first opening edge located at a side of the pixel opening in a first direction and a second opening edge located at a side of the pixel opening in an opposite direction of the first direction, and the pixel drive circuit is connected to at least one signal line extending along a second direction, with the first direction intersecting with the second direction; and in at least one sub-pixel, an orthographic projection of at least one of the first opening edge and the second opening edge on a plane of the display substrate is at least partially overlapped with an orthographic projection of the at least one signal line on the plane of the display substrate.

2. The display substrate according to claim 1, wherein in at least one sub-pixel, the at least one signal line at least comprises a first power supply line, and the orthographic projection of at least one of the first opening edge and the second opening edge on the plane of the display substrate is at least partially overlapped with an orthographic projection of the first power supply line on the plane of the display substrate.

3. The display substrate according to claim 1, wherein in at least one sub-pixel, the at least one signal line at least comprises a data signal line, and the orthographic projection of at least one of the first opening edge and the second opening edge on the plane of the display substrate is at least partially overlapped with an orthographic projection of the data signal line on the plane of the display substrate.

4. The display substrate according to claim 1, wherein in at least one sub-pixel, the at least one signal line at least comprises a compensation signal line, and the orthographic projection of at least one of the first opening edge and the second opening edge on the plane of the display substrate is at least partially overlapped with an orthographic projection of the compensation signal line on the plane of the display substrate.

5. The display substrate according to claim 1, wherein the plurality of sub-pixels comprise a first sub-pixel, a second sub-pixel, a third sub-pixel, and a fourth sub-pixel sequentially disposed along the first direction, and the at least one signal line at least comprises a first power supply line, a data signal line, and a compensation signal line; in the first sub-pixel, an orthographic projection of a first opening edge on the plane of the display substrate is at least partially overlapped with an orthographic projection of the data signal line on the plane of the display substrate, and an orthographic projection of a second opening edge on the plane of the display substrate is at least partially overlapped with an orthographic projection of the first power supply line on the plane of the display substrate; in the second sub-pixel, an orthographic projection of a first opening edge on the plane of the display substrate is at least partially overlapped with an orthographic projection of the compensation signal line on the plane of the display substrate, and an orthographic projection of a second opening edge on the plane of the display substrate is at least partially overlapped with the orthographic projection of the data signal line on the plane of the display substrate; in the third sub-pixel, an orthographic projection of a first opening edge on the plane of the display substrate is at least partially overlapped with the orthographic projection of the data signal line on the plane of the display substrate, and an orthographic projection of a second opening edge on the plane of the display substrate is at least partially overlapped with the orthographic projection of the compensation signal line on the plane of the display substrate; and in the fourth sub-pixel, an orthographic projection of a first opening edge on the base substrate is at least partially overlapped with the orthographic projection of the first power supply line on the plane of the display substrate, and an orthographic projection of a second opening edge on the plane of base substrate is at least partially overlapped with the orthographic projection of the data signal line on the plane of the display substrate.

6. A display apparatus, comprising the display substrate according to claim 1.

7. A method for driving the display substrate according to claim 1, wherein the display substrate at least comprises a first sub-base substrate and a second sub-base substrate that are spliced together, a splice line is formed at a junction where the first sub-base substrate and the second sub-base substrate are spliced; the first sub-base substrate at least comprises a first transition region close to the splice line and a first normal region located at a side of the first transition region away from the splice line, and the second sub-base substrate at least comprises a second transition region close to the splice line and a second normal region located at a side of the second transition region away from the splice line; each of the first transition region and the second transition region comprises at least one pixel column, wherein each pixel column comprises M sub-pixels, a sub-pixel at least comprises a pixel drive circuit, the pixel drive circuit is connected to a drive signal line, and M is a positive integer greater than 1; the method comprises:

processing at least one original drive signal of at least one pixel column in the first transition region and the second transition region into at least one processed drive signal; and supplying the at least one processed drive signal and remaining original drive signals to M pixel drive circuits in the pixel column through a drive signal line of the pixel column.

8. The driving method according to claim 7, wherein in at least one of the first transition region and the second transition region, a quantity of original drive signals in the pixel column gradually decreases and a quantity of processed drive signals in the pixel column gradually increases along a direction close to the splice line.

9. The method according to claim 7, wherein in at least one of the first transition region and the second transition region, a quantity of original drive signals in a pixel column farthest from the splice line is M.

10. The method according to claim 7, wherein in at least one of the first transition region and the second transition region, a quantity of processed drive signals in a pixel column closest to the splice line is M.

11. The method according to claim 7, wherein in at least one of the first transition region and the second transition region, a quantity of processed drive signals in a pixel column closest to the splice line is k*M, and a quantity of original drive signals is (1−k)*M, wherein k is from 0.2 to 0.8.

12. The method according to claim 11, wherein k=0.5.

13. The method according to claim 7, wherein the drive signal line comprises a data signal line, the drive signal comprises a data signal, and the at least one processed drive signal comprises a first data signal;

wherein processing the at least one original drive signal of the at least one pixel column in the first transition region and the second transition region into the at least one processed drive signal comprises:

processing data signals of each pixel column in the first transition region to enable data signals of an i-th pixel column to comprise M1 original data signals and M2 first data signals, wherein M1=M [(i−1)/(n−1)], and M2−M [1−(i−1)/(n−1)]; wherein n is a quantity of pixel columns in the first transition region, i=1, 2, . . . , n, and a serial number of the pixel columns gradually increases along a direction away from the splice line; a first data signal is V−ΔV, wherein V is an original data signal, and ΔV is an additional signal for changing the original data signal; and supplying the at least one processed drive signal and the remaining original drive signals to the M pixel drive circuits in the pixel column through the drive signal line of the pixel column comprises:

in each pixel column of the first normal region, the second transition region, and the second normal region, supplying M original data signals to M pixel drive circuits in the pixel column through the data signal line; and in each pixel column of the first transition region, supplying the M1 original data signals and the M2 first data signals to M pixel drive circuits in the pixel column through the data signal line.

14. The method according to claim 7, wherein the drive signal line comprises a data signal line, the drive signal comprises a data signal, and the at least one processed drive signal comprises a second data signal;

wherein processing the at least one original drive signal of the at least one pixel column in the first transition region and the second transition region into the at least one processed drive signal comprises:

processing data signals of each pixel column in the second transition region to make data signals of a j-th pixel column to comprise M3 original data signals and M4 second data signals, wherein M3=M [(j−1)/(n−1)], and M4=M [1−(j−1)/(n−1)]; wherein n is a quantity of pixel columns in the second transition region, j=1, 2, . . . , n, and a serial number of the pixel columns gradually increases along a direction away from the splice line; a second data signal is V+ΔV, wherein V is an original data signal, and ΔV is an additional signal for changing the original data signal; and supplying the at least one processed drive signal and the remaining original drive signals to the M pixel drive circuits in the pixel column through the drive signal line of the pixel column comprises:

in each pixel column of the first transition region, the first normal region, and the second normal region, supplying M original data signals to M pixel drive circuits in the pixel column through the data signal line; and in each pixel column of the second transition region, supplying the M3 original data signals and the M4 second data signals to M pixel drive circuits in the pixel column through the data signal line.

15. The method according to claim 7, wherein the drive signal line comprises a data signal line, the drive signal line comprises a data signal, and the at least one processed drive signal line comprises a first data signal and a second data signal;

wherein processing the at least one original drive signal of the at least one pixel column in the first transition region and the second transition region into the at least one processed drive signal comprises:

processing data signals of each pixel column of the first transition region and the second transition region to make data signals of an i-th pixel column in the first transition region to comprise M1 original data signals and M2 first data signals, and to make data signals of a j-th pixel column in the second transition region to comprise M3 original data signals and M4 second data signals, M1−0.5*M [(i−1)/(n−1)], M2−0.5*M [1−(i−1)/(n−1)], M3−0.5*M [(j−1)/(n−1)], and M4=0.5*M [1−(j−1)/(n−1)]; wherein n is a quantity of pixel columns in the first transition region and the second transition region, i=1, 2, . . . , n, j=1, 2, . . . , n, and a serial number of the pixel columns gradually increases along a direction away from the splice line; a first data signal is V−ΔV, a second data signal is V+ΔV, wherein V is an original data signal, and ΔV is an additional signal for changing the original data signal; and supplying the at least one processed drive signal and the remaining original drive signals to the M pixel drive circuits in the pixel column through the drive signal line of the pixel column comprises:

in each pixel column of the first normal region and the second normal region, supplying M original data signals to M pixel drive circuits in the pixel column through the data signal line; in each pixel column of the first transition region, supplying the M1 original data signals and the M2 first data signals to M pixel drive circuits in the pixel column through the data signal line; and in each pixel column of the second transition region, supplying the M3 original data signals and the M4 second data signals to M pixel drive circuits in the pixel column through the data signal line.

16. The method according to claim 7, wherein the drive signal line comprises a compensation signal line, the drive signal comprises a compensation signal, and the at least one processed drive signal comprises a first compensation signal;

wherein processing the at least one original drive signal of the at least one pixel column in the first transition region and the second transition region into the at least one processed drive signal comprises:

extracting compensation signals of each pixel column in the second transition region, processing compensation signals of each pixel column in the first transition region to make compensation signals of an i-th pixel column in the first transition region to comprise M1 original compensation signals and M2 first compensation signals, M1=M [(i−1)/(n−1)], M2=M [1−(i−1)/(n−1)]; wherein n is a quantity of pixel columns in the first transition region; an original compensation signal is a compensation signal of the i-th pixel column in the first transition region, a first compensation signal is a compensation signal of a j-th pixel column in the second transition region, i=1, 2, . . . , n, j=1, 2, . . . , n, and a serial number of the pixel columns gradually increases along a direction away from the splice line; and supplying the at least one processed drive signal and the remaining original drive signals to the M pixel drive circuits in the pixel column through the drive signal line of the pixel column comprises:

in each pixel column of the first normal region, the second transition region, and the second normal region, supplying M original compensation signals to M pixel drive circuits in the pixel column through the compensation signal line; and in each pixel column of the first transition region, supplying the M1 original compensation signals and the M2 first compensation signals to M pixel drive circuits in the pixel column through the compensation signal line.

17. The method according to claim 7, wherein the drive signal line comprises a compensation signal line, the drive signal comprises a compensation signal, and the at least one processed drive signal comprises a second compensation signal;

wherein processing the at least one original drive signal of the at least one pixel column in the first transition region and the second transition region into the at least one processed drive signal comprises:

extracting compensation signals of each pixel column in the first transition region, processing compensation signals of each pixel column in the second transition region to make compensation signals of a j-th pixel column in the second transition region to comprise M3 original compensation signals and M4 second compensation signals, M3=M [(j−1)/(n−1)], M4=M [1−(j−1)/(n−1)]; wherein n is a quantity of pixel columns in the second transition region; an original compensation signal is a compensation signal of the j-th pixel column in the second transition region, a second compensation signal is a compensation signal of the i-th pixel column in the first transition region, i=1, 2, . . . , n, j=1, 2, . . . , n, and a serial number of the pixel columns gradually increases along a direction away from the splice line; and supplying the at least one processed drive signal and the remaining original drive signals to the M pixel drive circuits in the pixel column through the drive signal line of the pixel column comprises:

in each pixel column of the first transition region, the first normal region, and the second normal region, supplying M original compensation signals to M pixel drive circuits in the pixel column through the compensation signal line; and in each pixel column of the second transition region, supplying the M3 original compensation signals and the M4 second compensation signals to M pixel drive circuits in the pixel column through the compensation signal line.

18. The method according to claim 7, wherein the drive signal line comprises a compensation signal line, the drive signal comprises a compensation signal, and the at least one processed drive signal comprises a first compensation signal and a second compensation signal;

wherein processing the at least one original drive signal of the at least one pixel column in the first transition region and the second transition region into the at least one processed drive signal comprises:

extracting compensation signals of each pixel column in the first transition region and the second transition region, processing compensation signals of each pixel column in the first transition region and the second transition region to make compensation signals of an i-th pixel column in the first transition region to comprise M1 original compensation signals and M2 first compensation signals, and to make compensation signals of a j-th pixel column in the second transition region to comprise M3 original compensation signals and M4 second compensation signals, M1=M [(i−1)/(n−1)], M2=M [1−(i−1)/(n−1)], M3=M [(j−1)/(n−1)], and M4=M [1−(j−1)/(n−1)]; wherein n is a quantity of pixel columns in the first transition region and the second transition region, i=1, 2, . . . , n, j=1, 2, . . . , n, and a serial number of the pixel columns gradually increases along a direction away from the splice line; an original compensation signal of the first transition region is a compensation signal of the i-th pixel column in the first transition region, and a first compensation signal is a compensation signal of the j-th pixel column in the second transition region; an original compensation signal of the second transition region is a compensation signal of the j-th pixel column in the second transition region, and a second compensation signal is a compensation signal of the i-th pixel column in the first transition region; and supplying the at least one processed drive signal and the remaining original drive signals to the M pixel drive circuits in the pixel column through the drive signal line of the pixel column comprises:

in each pixel column of the first normal region and the second normal region, supplying M original compensation signals to M pixel drive circuits in the pixel column through the compensation signal line; in each pixel column of the first transition region, supplying the M1 original compensation signals and the M2 first compensation signals to M pixel drive circuits in the pixel column through the compensation signal line; and in each pixel column of the second transition region, supplying the M3 original compensation signals and the M4 second compensation signals to M pixel drive circuits in the pixel column through the compensation signal line.

19. A driving device, comprising a processor and a memory in which a computer program runnable on the processor is stored, wherein steps of the method for driving a display substrate according to claim 7 are implemented when the processor executes the program.

20. A non-transitory computer-readable storage medium in which program instructions are stored, wherein when the program instructions are executed, the method for driving a display substrate according to claim 7 is be performed.

\* \* \* \* \*